(12) United States Patent
Asai et al.

(10) Patent No.: US 7,851,884 B2
(45) Date of Patent: Dec. 14, 2010

(54) FIELD-EFFECT TRANSISTOR, SEMICONDUCTOR CHIP AND SEMICONDUCTOR DEVICE

(75) Inventors: Shuji Asai, Kanagawa (JP); Akira Fujihara, Kanagawa (JP); Makoto Matsunoshita, Kanagawa (JP); Naoki Sakura, Kanagawa (JP); Seiji Ichikawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 63 days.

(21) Appl. No.: 12/232,788

(22) Filed: Sep. 24, 2008

(65) Prior Publication Data
US 2009/0078966 A1   Mar. 26, 2009

(30) Foreign Application Priority Data
Sep. 25, 2007  (JP) .............................. 2007-247574

(51) Int. Cl.
*H01L 23/48* (2006.01)
(52) U.S. Cl. .............................. 257/523; 257/E29.246; 257/E23.01
(58) Field of Classification Search .................. 257/194, 257/690, 774, E29.246, E23.01, 282, 523, 257/289, 192; 438/667, 725, 745
See application file for complete search history.

(56) References Cited

U.S. PATENT DOCUMENTS

| | | | |
|---|---|---|---|
| 4,424,525 A | 1/1984 | Mimura | |
| 5,504,353 A * | 4/1996 | Kuzuhara | 257/194 |
| 7,004,325 B2 | 2/2006 | Shoji | |
| 7,187,073 B2 | 3/2007 | Shoji | |
| 2003/0000573 A1 * | 1/2003 | Yoshioka et al. | 137/78.3 |
| 2003/0209465 A1 | 11/2003 | Shoji | |

(Continued)

FOREIGN PATENT DOCUMENTS

JP        56-94780        7/1981

(Continued)

OTHER PUBLICATIONS

Huang et al., "An AlGaAs/InGaAs Pseudomorphic High Electron Mobility Transistor (PHEMT) . . . ", 1991, IEEE MTT-S Digest, pp. 713-716.*

(Continued)

*Primary Examiner*—Thomas L Dickey
*Assistant Examiner*—Nikolay Yushin
(74) *Attorney, Agent, or Firm*—McGinn IP Law Group, PLLC

(57) ABSTRACT

A FET exhibiting excellent uniformity and productivity and having a low noise figure and high associated gain as high-frequency performance, a semiconductor chip having this FET and a semiconductor device having the semiconductor chip. The FET includes a GaAs substrate on which are built up an i-type GaAs layer, an i-type InGaAs two-dimensional electron gas layer and an n-type AlGaAs electron supply layer. A gate electrode is provided on and in linear Schottky contact with the n-type AlGaAs electron supply layer. A n-type InGaP etching stop layer and then an n-type GaAs contact layer at the same lateral position are built up on the n-type AlGaAs electron supply layer, these being spaced away from both sides of the gate electrode. A source electrode and a drain electrode are provided on the n-type GaAs contact layer and are spaced away from edges of the contact layer as electrodes that make band-shaped ohmic contact.

26 Claims, 27 Drawing Sheets

U.S. PATENT DOCUMENTS

2004/0104404 A1\* 6/2004 Bito .......................... 257/192
2004/0227248 A1\* 11/2004 Fukuzumi et al. ........... 257/758
2005/0253227 A1 11/2005 Shoji

FOREIGN PATENT DOCUMENTS

| JP | 07-335867 | \* 12/1995 |
| JP | 2581452 | 11/1996 |
| JP | 2611474 | 2/1997 |
| JP | 2626209 | 4/1997 |
| JP | 2685032 | 8/1997 |
| JP | 2755076 | 3/1998 |
| JP | 2755244 | 3/1998 |
| JP | 2822739 | 9/1998 |
| JP | 2002-334944 | 11/2002 |

OTHER PUBLICATIONS

English translation of JP-07-335867, of Dec. 1995.\*

"Low-noise HEMT—Deciding the Characteristics Thereof" [pp. 239-260, Fig. 9.6(b) on p. 243]; (Collected Papers) Semiconductor Research vol. 35; Crystal Growth of Compound Semiconductor and Evaluation; Editor: Junichi Nishizawa; Publisher: Kogyo Chosakai K.K.; Publication Date: Aug. 5, 1991; ISBN 4-7693-1089-7 C3055.

\* cited by examiner

US 7,851,884 B2

FIELD-EFFECT TRANSISTOR, SEMICONDUCTOR CHIP AND SEMICONDUCTOR DEVICE

REFERENCE TO RELATED APPLICATION

This application is based upon and claims the benefit of the priority of Japanese patent application No. 2007-247574, filed on Sep. 25, 2007, the disclosure of which is incorporated herein in its entirety by reference thereto.

TECHNICAL FIELD

This invention relates to a field-effect transistor of Schottky-coupled-gate type and, more particularly, to a field-effect transistor formed on a gallium-arsenide substrate. Further, the invention relates to a semiconductor chip having such a field-effect transistor and to a semiconductor device having this semiconductor chip.

BACKGROUND

The spread of satellite broadcasts and microwave communications has been accompanied by increasing demand for low-noise amplification elements used in the first stage of the high-frequency amplifying circuit that receives the signal. In particular, field-effect transistors (FETs) formed on a gallium-arsenide (GaAs) substrate are primarily used for satellite broadcasts having a frequency on the order of 10 GHz.

In such a semiconductor element, what is sought is that the semiconductor element itself does not produce noise anew to the greatest degree possible when an extremely weak high-frequency signal as from an antenna is amplified by an initial input stage. That is, what is sought is a semiconductor element having a small noise figure (NF). The term "noise figure" relates to the magnification from a power ratio of a signal component to a noise component at an input terminal to a power ratio of the signal component to the noise component at an output terminal, i.e., the rate of increase in the noise component, and it indicates noise added on by the semiconductor elements in the amplifier circuit. A minimum noise figure NFmin, which is the minimum noise figure obtained by adjusting input/output impedances under certain bias conditions, and associated gain (Ga), which is the power gain at such time, are used as indices for evaluating semiconductor elements. Both of these values are expressed in dB units of a common logarithm.

In the case of a FET serving as the semiconductor element in an amplifying circuit, the minimum noise figure NFmin should be made small. To achieve this, mutual conductance gm should be enlarged and gate capacitance Cgs, gate-series resistance Rg and source-series resistance Rs, which are parasitic components, should be made small. The resistance component in particular is a source of thermal noise. Further, with regard to power gain or associated gain Ga as the amplification factor, it is desired that cut-off frequency ft be raised and that drain conductance gd indicative of saturation of drain current be made small. Enlarging mutual conductance gm is effective in order to raise the cut-off frequency ft, and reducing gate length Lg is effective in order to reduce gate capacitance Cgs. In order to enlarge mutual conductance gm, it is desired that gate length Lg be reduced and that carrier mobility of the channel semiconductor layer be raised.

Patent Document 1 discloses a high electron mobility transistor (HEMT) representing early technology regarding low-noise FETs. The semiconductor device described in Patent Document 1 includes a semiconductor substrate on which are provided a single semiconductor channel layer of high resistance and an impurity-doped semiconductor layer having an electron affinity lower than that of the single semiconductor channel layer, these forming a heterojunction; a gate electrode provided on this semiconductor layer; and a source electrode and a drain electrode formed on respective ones of the sides of the gate electrode. Patent Document 1 indicates that in such a semiconductor device, a two-dimensional electron gas (2DEG) exhibiting a high electron mobility is induced within an i-type GaAs layer in the vicinity of the heterojunction interface, e.g., in the vicinity of the interface between an n-type AlGaAs layer and the undoped (i-type) GaAs layer. Application to low-noise FETs began with this semiconductor device and semiconductor elements with a large mutual conductance gm and small noise figure NF have been realized.

FIG. 25 is a sectional view of a field-effect transistor 501 described in Non-Patent Document 1. The field-effect transistor 501 described in Non-Patent Document 1 has a semi-insulating GaAs substrate 502 on which are provided an undoped (i-type) GaAs layer 503 serving as a buffer layer; an undoped (i-type) InGaAs layer 504 serving as a channel layer; an undoped (i-type) AlGaAs layer 505 serving as a spacer layer; an n-type AlGaAs layer 506 serving as an electron supply layer; and an n-type GaAs layer 507 serving as a contact layer. This field-effect transistor is also referred to as a "pseudomorphic HEMT". At a heterojunction interface having distortion between the n-type AlGaAs layer 506 and the i-type InGaAs layer 504, a higher electron mobility is obtained in comparison with an i-type GaAs layer. With a low-noise FET to which this higher electron mobility has been applied, the minimum noise figure NFmin declines and the associated gain Ga rises, meaning that performance is enhanced. In FIG. 25, a gate electrode 510 exhibiting Schottky contact is provided so as to contact the surface of a recess formed part of the way into the n-type AlGaAs electron supply layer 506. An ohmic-contact pair of source electrode 508 and drain electrode 509 is provided on respective remaining portions of the n-type GaAs contact layer 507 on both flanks of the gate electrode 510.

A method of manufacturing the field-effect transistor set forth in FIG. 25 will be described. First, the undoped (i-type) GaAs buffer layer 503, undoped (i-type) InGaAs channel layer 504, undoped (i-type) AlGaAs spacer layer 505, n-type AlGaAs electron supply layer 506 and n-type GaAs contact layer 507 are grown successively on the GaAs substrate 502 by molecular beam epitaxy (MBE) or metal organic vapor-phase epitaxy (MOVPE).

First, as a method of manufacturing an FET, the electrically conductive semiconductor layers, namely the n-type AlGaAs electron supply layer 506 and n-type GaAs contact layer 507 grown epitaxially on the GaAs substrate, are isolated by mesa etching. Next, a pair of mutually opposing ohmic electrodes is formed on the remaining regions of the electrically conductive semiconductor layers. Further, monitor elements having ohmic-electrode lead-pad terminals are provided on portions of the substrate in such a manner that current can be measured by bringing a metal needle into abutting contact with the pair of ohmic electrodes. Next, a photoresist film having a slender opening is formed between the pair of ohmic electrodes so as to cross the remaining regions of the conductive semiconductor layers. Further, an opening through which the metal needle makes contact is formed above the pad terminals of the ohmic electrodes. Next, a recess is formed part of the way into the n-type AlGaAs electron supply layer 506 using an etching solution. Such etching is repeated until the current that flows between the pad terminals of the monitor elements falls within a prescribed range of current values. Next, if the prescribed current value is attained, a Schottky metal such as aluminum (Al) is vapor-deposited in the openings, a lift-off treatment is applied by dissolving the photoresist mask using an organic solvent, and the gate electrode 510 is formed in the recess. Further, the ohmic electrodes that have been formed on the n-type GaAs contact layer 507 on both sides of the gate electrode become the source electrode 508 and drain electrode 509. The basic FET structure is thus formed.

Primarily, a dilute solution of sulfuric acid or phosphoric acid, hydrogen peroxide solution and pure water is used as the etching solution for the recess. With this etching solution, GaAs and AlGaAs can be etched isotropically at the same etching speed. On the other hand, if dry etching is used to form the recess, the semiconductor layer is damaged. In order to manufacture a low-noise FET, therefore, wet etching is better.

With wet etching, however, making the AlGaAs layer an etching-stop layer was difficult. Accordingly, in a field-effect transistor described in Patent Document 2, wet etching is controlled by using an InGaP layer as a stop layer.

FIG. 26 is a sectional view illustrating the field-effect transistor 511 described in Patent Document 2. The field-effect transistor (FET) 511 described in Patent Document 2 will be described based upon the method of manufacture. An epitaxial substrate used in the FET 511 is built up on a semi-insulating GaAs substrate 512 using metal organic vapor-phase epitaxy (MOVPE), by way of example. A buffer layer 513 of undoped (i-type) GaAs or undoped (i-type) AlGaAs, an n-type AlGaAs electron supply layer (lower layer) 514, an undoped (i-type) InGaAs channel layer 515, an n-type AlGaAs electron supply layer (upper layer) 516, an undoped (i-type) AlGaAs Schottky layer 517, an n-type InGaP contact lower layer 518 and an n-type GaAs contact upper layer 519 are grown epitaxially on the semi-insulating GaAs substrate 512 in the order mentioned.

Next, by using an etching solution of sulfuric acid and hydrogen peroxide solution ($H_2SO_4$—$H_2O_2$—$H_2O$), a first recess opening penetrating the n-type GaAs contact upper layer 519 is formed. Since almost no etching of the n-type InGaP contact lower layer 518 by this etching solution takes place, etching in the depth direction of the first recess opening is stopped automatically at the moment the n-type GaAs contact upper layer 519 is penetrated and the surface of the n-type InGaP contact lower layer 518 is exposed. Next, after a photoresist film is formed, a second recess opening having a width smaller than that of the first recess opening is formed within the first recess opening using, e.g., a dilute hydrochloric acid (HCl—$H_2O$) etching solution. Since almost no etching of the GaAs or AlGaAs layer takes place by this solution, etching in the depth direction of the second recess opening is stopped automatically at the moment the n-type InGaP contact lower layer 518 is penetrated and the surface of the undoped AlGaAs Schottky layer 517 is exposed. Next, a gate electrode 522 is formed on the surface of the undoped AlGaAs Schottky layer 517 exposed at the bottom of the second recess opening. Finally, a source electrode 520 and a drain electrode 521 are formed on the surface of the n-type GaAs contact upper layer 519 on respective ones of the two sides bracketing the gate electrode 522 and first recess opening. Ohmic contact is then formed by a thermal treatment.

FIG. 27 is a sectional view illustrating a field-effect transistor 531 described in Patent Document 3. An n-type InGaP contact layer 534 is utilized as a wet-etching stop layer also in the field-effect transistor 531 described in Patent Document 3. However, one difference from Patent Document 2 is that the lower portion of a gate electrode 538 is embedded with its bottom surface in contact with an n-type AlGaAs electron supply layer 533 and its side surface in contact with the n-type InGaP contact layer 534. In addition, a channel layer 532 of undoped (i-type) GaAs or InGaAs is provided beneath the n-type AlGaAs electron supply layer 533, an n-type GaAs contact layer 535 is provided on the n-type InGaP contact layer 534, and a source electrode 536 and a drain electrode 537 are provided on respective sides of the contact layer 535.

Patent Documents 4 and 5 disclose a wiring structure of a field-effect transistor (semiconductor device) of improved noise characteristic and gain characteristic. By placing drain wiring over source wiring with a gap interposed therebetween (an air-bridge scheme), parasitic capacitance between the intersecting wiring traces is reduced.

Patent Document 6 discloses a method of manufacturing a semiconductor device having shallow ohmic contact, wherein the method builds up an AuGe film and Au film on a thin nickel (Ni) film and applies an alloying thermal treatment.

Patent Document 7 discloses a heterojunction field-effect transistor in which electron mobility of a two-dimensional electron gas is raised by thinly inserting an i-type GaAs layer as a spacer layer, the thickness of which is on the order of 2 nm, at the interface of an n-type AlGaAs layer and i-type InGaAs layer.

Patent Document 8 discloses a molded package having a hollow structure, and Patent Document 9 a molded cap for a semiconductor device.

[Patent Document 1]

Japanese Patent Kokai Publication No. JP-A-56-94780

[Patent Document 2]

Japanese Patent Kokai Publication No. JP-A-7-335867 (FIG. 1) (Related document: Japanese Patent No. 2581452)

[Patent Document 3]

Japanese Patent Kokai Publication No. JP-A-8-340012 (FIG. 1) (Related document: Japanese Patent No. 2685032)

[Patent Document 4]

Japanese Patent Kokai Publication No. JP-A-4-96339 (Related document: Japanese Patent No. 2626209)

[Patent Document 5]

Japanese Patent Kokai Publication No. JP-A-5-211179 (Related document: Japanese Patent No. 2822739)

[Patent Document 6]

Japanese Patent Kokai Publication No. JP-A-3-231424 (Related document: Japanese Patent No. 2611474)

[Patent Document 7]

Japanese Patent Kokai Publication No. JP-A-6-163599 (Related document: Japanese Patent No. 2755076)

[Patent Document 8]

Japanese Patent Kokai Publication No. JP-P2002-334944A

[Patent Document 9]

Japanese Patent Kokai Publication No. JP-A-9-213827 (Related document: Japanese Patent No. 2755244)

[Non-Patent Document 1]

H. Tokuda: "Low-noise HEMT—Deciding the Characteristics Thereof" [pp. 239-260, FIG. 9.6(b) on page 243)]; (Collected Papers) Semiconductor Research Vol. 35; Crystal Growth of Compound Semiconductor and Evaluation; Editor: Junichi Nishizawa; Publisher: Kogyo Chosakai K. K.; Publication Date: Aug. 5, 1991; ISBN 4-7693-1089-7 C3055

SUMMARY OF THE DISCLOSURE

The entire disclosures of Patent Documents 1-9 and Non-Patent Document 1 are incorporated herein by reference thereto. The following analyses are given by the present invention.

Problems that the present invention attempts to solve are as follows:

In the etching of the recess in the field-effect transistor described in Non-Patent Document 1 (FIG. 25), it is required that this treatment be performed while checking etching depth by measuring current using the monitor elements. Consequently, it is required that etching and current measurement be repeated, resulting in poor productivity. Further, owing to such etching, homogeneity in the wafer surface and reproducibility between wafers are not so good, and variations develop in such FET characteristics as the gate threshold voltage.

In the field-effect transistors described in Patent Documents 2 and 3, a two-step recess and an embedded-gate structure are adopted for the purpose of large-amplitude output amplification. As a consequence, the FET takes on a complicated structure and it is necessary to apply a photoresist film for each step of the two-step recess in order to obtain the two-step recess. However, since it is required that a low-noise FET used in satellite broadcast and microwave communications be low in cost, it is desired that the FET structure and method of manufacture be simple. In addition, for a general-purpose, microwave-band amplification element, low cost is required along with not only a low-noise characteristic but also with a suitable high-frequency performance. In other words, it is difficult to satisfy this requirement with the field-effect transistors described in Patent Documents 2 and 3.

In the field of satellite broadcast and microwave communications, there is demand for a field-effect transistor having a small noise figure NFmin and high associated gain Ga or field-effect transistor having a suitable high-frequency performance, which transistor can be obtained by a method exhibiting excellent homogeneity, ease of production and productivity.

In accordance with a first aspect of the present invention, there is provided a field-effect transistor comprising the following layers built up on a GaAs semiconductor substrate comprising gallium and arsenic: an i-type GaAs layer as a buffer layer comprising gallium and arsenic and containing no carrier impurities; an i-type InGaAs layer as a two-dimensional gas layer comprising indium, gallium and arsenic and containing no carrier impurities; and an n-type AlGaAs layer as an electron supply layer comprising aluminum, gallium and arsenic and containing an n-type carrier impurity; a gate electrode being provided on and in linear Schottky contact with the n-type AlGaAs layer serving as the electron supply layer; further comprising an n-type InGaP layer as an etching stop layer spaced away from both sides of the gate electrode and comprising indium, gallium and phosphorous and containing an n-type carrier impurity, and, at the substantially same (or similar) lateral position, an n-type GaAs layer as a contact layer comprising gallium and arsenic and containing an n-type carrier impurity, these being built up successively on the n-type AlGaAs layer serving as the electron supply layer; and a source electrode and a drain electrode provided as electrodes on and in band-shaped ohmic contact with the n-type GaAs layer serving as the contact layer, these electrodes being placed on respective sides and spaced away from edges of the contact layer.

In accordance with a second aspect of the present invention, there is provided a square semiconductor chip comprising: a field-effect transistor including the following layers built up on a GaAs semiconductor substrate comprising gallium and arsenic: an i-type GaAs layer as a buffer layer comprising gallium and arsenic and containing no carrier impurities; an i-type InGaAs layer as a two-dimensional gas layer comprising indium, gallium and arsenic and containing no carrier impurities; and an n-type AlGaAs layer as an electron supply layer comprising aluminum, gallium and arsenic and containing an n-type carrier impurity; a gate electrode being provided on and in linear Schottky contact with the n-type AlGaAs layer 5 serving as the electron supply layer; further including an n-type InGaP layer as an etching stop layer spaced away from both sides of the gate electrode and comprising indium, gallium and phosphorous and containing an n-type carrier impurity, and, at the substantially same (or similar) lateral position, an n-type GaAs layer as a contact layer comprising gallium and arsenic and containing an n-type carrier impurity, these being built up successively on the n-type AlGaAs layer serving as the electron supply layer; and a source electrode and a drain electrode provided as electrodes on and in band-shaped ohmic contact with the n-type GaAs layer serving as the contact layer, these electrodes being placed on respective sides and spaced away from edges of the contact layer; the field-effect transistor being formed as at least one element region; an element isolation region electrically insulating the element region; an input terminal electrically connected to the gate electrode; a ground terminal electrically connected to the source electrode; and an output terminal electrically connected to the drain electrode; wherein in the element isolation region and from among four extremities which are sides or corners of the square semiconductor chip, the input terminal and the output terminal are disposed at two mutually opposing extremities so as to oppose each other; and at least one ground terminal is disposed at the other mutually opposing extremities.

In accordance with a third aspect of the present invention, there is provided a semiconductor device having a square semiconductor chip comprising: a field-effect transistor including the following layers built up on a GaAs semiconductor substrate comprising gallium and arsenic: an i-type GaAs layer as a buffer layer comprising gallium and arsenic and containing no carrier impurities; an i-type InGaAs layer as a two-dimensional gas layer comprising indium, gallium and arsenic and containing no carrier impurities; and an n-type AlGaAs layer as an electron supply layer comprising aluminum, gallium and arsenic and containing an n-type carrier impurity; a gate electrode being provided on and in linear Schottky contact with the n-type AlGaAs layer serving as the electron supply layer; further including an n-type InGaP layer as an etching stop layer spaced away from both sides of the gate electrode and comprising indium, gallium and phosphorous and containing an n-type carrier impurity, and, at the same lateral position, an n-type GaAs layer as a contact layer comprising gallium and arsenic and containing an n-type carrier impurity, these being built up successively on the n-type AlGaAs layer serving as the electron supply layer; and a source electrode and drain electrode provided as electrodes on and in band-shaped ohmic contact with the n-type GaAs layer serving as the contact layer, these electrodes being placed on respective sides and spaced away from edges of the contact layer; the field-effect transistor being formed as at least one element region; an element isolation region electrically insulating the element region; an input terminal electrically connected to the gate electrode; a ground terminal electrically connected to the source electrode; and an output terminal electrically connected to the drain electrode; wherein in the element isolation region and from among four extremities which are sides or corners of the square semiconductor chip, the input terminal and the output terminal are disposed at two mutually opposing extremities so as to oppose each other; at least one ground terminal is disposed at the other mutually opposing extremities; and the semiconductor chip is accommodated in a hollow package formed of resin or ceramic the interior of which is a hollow vessel, four terminal leads are led out from within the hollow package, and at least three of the terminals and the four terminal leads of the semiconductor chip are electrically connected by metal wires in such a manner that at least one terminal lead corresponds to one terminal.

In accordance with a fourth aspect of the present invention, there is provided a semiconductor device having a square semiconductor chip comprising: a field-effect transistor including the following layers built up on a GaAs semiconductor substrate comprising gallium and arsenic: an i-type GaAs layer as a buffer layer comprising gallium and arsenic and containing no carrier impurities; an i-type InGaAs layer as a two-dimensional gas layer comprising indium, gallium and arsenic and containing no carrier impurities; and an n-type AlGaAs layer as an electron supply layer comprising aluminum, gallium and arsenic and containing an n-type carrier impurity; a gate electrode being provided on and in linear Schottky contact with the n-type AlGaAs layer serving as the electron supply layer; further including an n-type InGaP layer as an etching stop layer spaced away from both sides of the gate electrode and comprising indium, gallium and phosphorous and containing an n-type carrier impurity, and, at the same lateral position, an n-type GaAs layer as a contact layer comprising gallium and arsenic and containing an n-type carrier impurity, these being built up successively on the n-type AlGaAs layer serving as the electron supply layer; and a source electrode and drain electrode provided as electrodes on and in band-shaped ohmic contact with the n-type GaAs layer serving as the contact layer, these electrodes being placed on respective sides and spaced away from edges of the contact layer; the field-effect transistor being formed as at least one element region; an element isolation region electrically insulating the element region; an input terminal electrically connected to the gate electrode; a ground terminal electrically connected to the source electrode; and an output terminal electrically connected to the drain electrode; and further having a resin or ceramic circuit board with circuit wiring formed on a surface thereof; wherein the wiring of the circuit board is electrically connected to the input terminal, the ground terminal and the output terminal in such a manner that a surface of the semiconductor chip on which the element isolation region has been formed will face the circuit board, the semiconductor chip and the circuit board forming a hollow space therebetween.

The meritorious effects of the present invention are summarized as follows.

In accordance with the present invention, the structure of a single-step recess is realized using a wet-etching stop layer, as a result of which good productivity and a uniform FET characteristic are obtained. Further, the channel layer of the FET is managed with a high precision by the epitaxial growth technique of the semiconductor layer. This precision improves the electrical characteristics of the FET. By using the etching stop layer, it is unnecessary to adjust depth by repeatedly cutting a recess while measuring current value using monitor elements. This makes it possible to improve productivity and the accuracy of the FET characteristics.

Further, recess formation without using an etching stop layer is isotropic and side etching in the lateral direction cannot be controlled independently. However, in the FET of the present invention, side etching in the lateral direction can be controlled independently by using an etching stop layer. That is, since the spacing between the gate electrode and contact layer can be controlled, adjustment can be performed so as to obtain high-frequency performance. Further, lateral side etching utilizing the etching stop layer is a trace amount of etching within a slender (thin) gap. Therefore, in comparison with recess formation vertically etched from an opening, controllability and reproducibility based upon etching time are excellent.

Furthermore, an n-type InGaP layer is used as the etching stop layer. The n-type InGaP layer has a Schottky-contact barrier height of about 0.7 eV, which is low in comparison with a value of about 1.0 eV in the case of an n-type AlGaAs layer. This difference is reflected in the forward voltage and reverse breakdown voltage of the gate. With the FET of the present invention, the n-type InGaP layer serving as the initial etching stop layer is removed by a separate etching solution, the next n-type AlGaAs layer is exposed as the etching stop layer and the gate electrode is made to contact the n-type AlGaAs layer, whereby the forward voltage of the gate can be assured in excellent fashion.

On the other hand, below the source electrode and drain electrode serving as the ohmic electrodes, the n-type InGaP layer serving as the etching stop layer is inserted beneath the n-type GaAs layer serving as the contact layer. By performing doping to a high-concentration n type with the thickness of this n-type InGaP layer being made 2 to 20 nm, which is enough thickness for it to function as an etching stop layer, contact resistance as a heterobarrier can be reduced.

Other features and advantages of the present invention will be apparent from the following description taken in conjunction with the accompanying drawings, in which like reference characters designate the same or similar parts throughout the figures thereof.

PREFERRED MODES OF THE INVENTION

First Exemplary Embodiment; General Cross-Sectional Structure of FET

Figure 1:
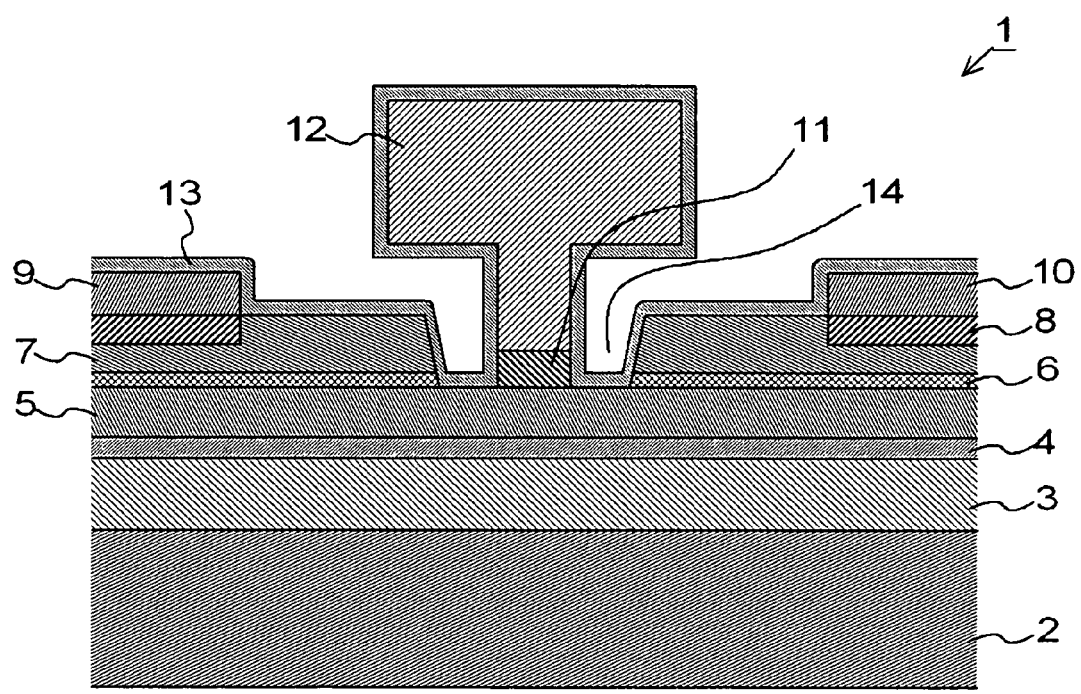
FIG. 1 is a sectional view of a field-effect transistor according to a first exemplary embodiment of the present invention.

An overview of a field-effect transistor according to a first exemplary embodiment of the present invention will be given first. This will be followed by a detailed description. FIG. 1 shows in general a sectional view of a field-effect transistor 1 according to the first exemplary embodiment of the present invention. The field-effect transistor (FET) 1 includes a high-resistance semi-insulating GaAs substrate 2 serving as a semiconductor substrate on which are provided an i-type GaAs layer 3 as a buffer layer; an i-type InGaAs layer 4 as a two-dimensional electron gas layer; a n-type AlGaAs layer 5 as an electron supply layer; an n-type InGaP layer 6 as an etching stop layer; and an n-type GaAs layer 7 as a contact layer. A source electrode 9 and a drain electrode 10 are formed on an ohmic alloy layer 8 formed on the n-type GaAs layer 7. A recess 14 that reaches the n-type AlGaAs layer 5 is formed between the source electrode 9 and the drain electrode 10. A gate electrode 12 is formed via a Schottky metal layer 11 on the n-type AlGaAs layer 5 exposed in the recess 14. The surface of the FET 1 is covered with a thin protective insulating film 13 such as SiN or the like. It should be noted that Ga, Al, In, As and P, which are element symbols representing the compound semiconductor layers, stand for gallium, aluminum, indium, arsenic and phosphorous, respectively. In the periodic table of the elements, Al, Ga and In belong to the IIIB group, and P and As belong to the VB group. Furthermore, although the i-type InGaAs layer 4 may be sometimes also referred to as a "channel layer", as in the patent documents mentioned in the background art, it will be referred to as a "two-dimensional electron gas (2DEG) layer" in the description below since, depending upon the gate voltage, a current flows also through the n-type AlGaAs layer 5 as a current supply layer, contributing as a channel.

In the FET 1 of the present invention, the recess 14 of the gate electrode 12 takes on the shape of a single step. That is, the n-type InGaP layer 6 and the n-type GaAs layer 7 do not form a staircase therebetween. Rather, the side surfaces of the n-type InGaP layer 6 and n-type GaAs layer 7 are flush and form a (flank of) single-step recess. As a result, in comparison with a FET having a two-step recess structure, the manufacturing process is simplified and productivity can be improved.

Further, the FET 1 is so adapted that the gate electrode 12 and n-type InGaP layer 6 do not come into contact. That is, the gate electrode 12 is formed by a prescribed distance away from the n-type InGaP layer 6 and n-type GaAs layer 7. In accordance with this structure, when the gate threshold voltage is on the order of, e.g., −1.0 V in the manner of negative depletion, mutual inductance gm is maximized with a gate voltage of about −0.4 V. That is, the minimum noise figure NFmin is minimized in this vicinity and a high associated gain Ga can be obtained. The drain bias condition at this time is, e.g., 10 mA at 2.0 V.

When an electrode of Schottky metal is brought into contact with a semiconductor surface and a potential of 0 V is applied, a surface depletion layer of the same order is produced on the semiconductor surface. Therefore, if there is a gap at the sides of the gate electrode 12 owing to the single-step gate structure, then a surface depletion layer will be produced on the semiconductor surface in this gap. Even if the voltage of the gate electrode 12 is made positive and the depletion layer produced beneath the gate is thinned and raised (pulled up) at this time, the surface depletion layer that extends to both sides of the gate electrode 12 thickens and the channel current that flows through the channel conductive layer is restricted. Controllability at the gate potential declines as a result. On the other hand, if the gate voltage is made negative to thicken and extend the depletion layer of the gate and it is so arranged that the depletion layer becomes longer than the surface depletion layer at the gate sides, then channel current can be controlled. Accordingly, a gate threshold voltage of about −1.0 V and a gate voltage in the vicinity of about −0.4 V are the conditions for raising the amplification factor, reducing the noise figure NF and manifesting good performance. Further, suppressing an increase in drain current with respect to gate voltage by the surface depletion layer and obtaining a substantially constant mutual conductance gm is desirable in terms of an analog amplifying element for which a linear amplification is sought.

An effect of the surface depletion layer extended at the sides of the gate electrode 12 is that in a state in which the gate voltage is −0.4 V and the depletion layer of the gate electrode 12 extends from (or beyond) the surface depletion layer at the sides of the gate electrode 12, the concentration of an electric field, which is due to the drain voltage, below the depletion layer of the gate electrode 12 is weakened owing to dispersion (spreading) of the surface depletion layer that has been slightly extended at the skirts (side, proximity) of the side edges of the gate electrode 12. As a result, drain breakdown voltage rises, saturation of the drain voltage is improved and the drain conductance gd can be reduced.

Next, a brief description will be given regarding the dependence of the electrical characteristics on the spacing (contact spacing) between the gate electrode 12 and contact layer 6 at the bottom of the recess 14. The contact spacing is dependent upon the etching time and becomes larger as side etching proceeds. As for saturation of drain current with respect to drain voltage, a contact spacing larger than 0.10 µm results in better saturation of the drain current. If the contact spacing is less than 0.10 µm, e.g., 0.05 to 0.08 µm, saturation of the drain current becomes non-uniform and deteriorates and there is large variation in drain current Idss at a gate voltage Vgs of 0 V. When saturation of drain current deteriorates, i.e., when drain conductance gd increases, power gain and maximum oscillation frequency fmax decline. Further, if contact spacing is greater than 0.3 µm, minimum noise figure NFmin and associated gain Ga decline. On the other hand, drain breakdown voltage rises as the contact spacing widens.

Figure 2:
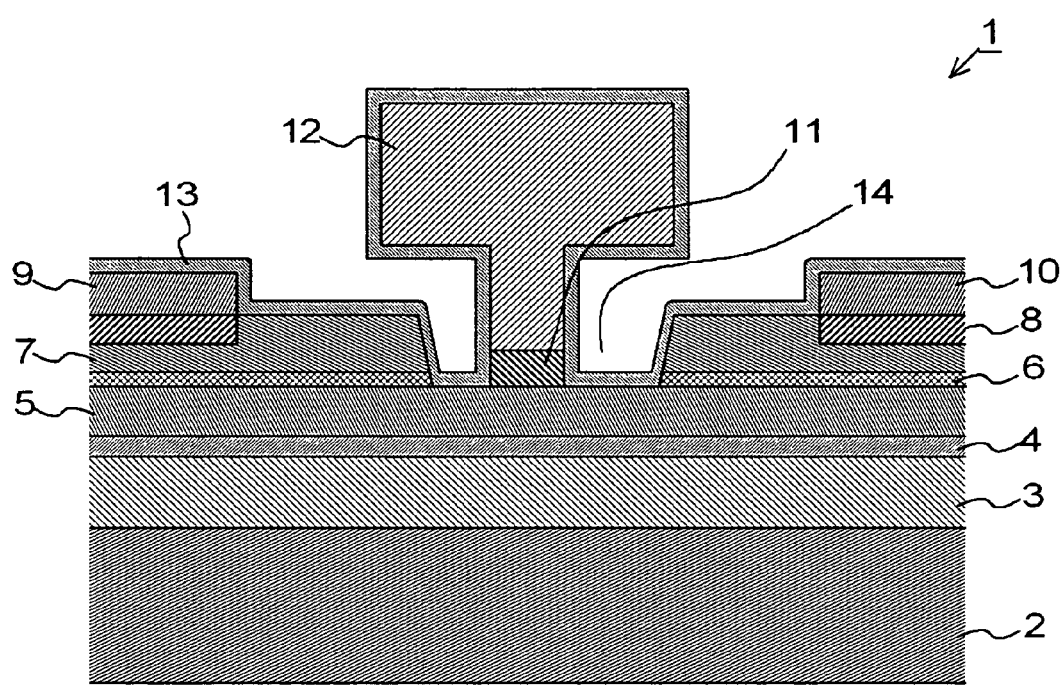
FIG. 2 is a sectional view illustrating a variant mode of a field-effect transistor according to the first exemplary embodiment of the present invention.

The first object of the FET 1 of the present invention is to attain a low-noise characteristic for first-stage amplification. However, since the FET structure is simple and the FET characteristic exhibits good uniformity, the FET can also be provided (supplied) as a low-cost FET for intermediate-stage amplification. In this case, the requirement for the low-noise characteristic diminishes and it becomes necessary to raise drain breakdown voltage under a suitable high-frequency amplification characteristic. In order to raise drain breakdown voltage, the carrier concentration of the n-type AlGaAs layer 5 serving as the electron supply layer is set lower than that for low noise and the contact spacing can be set suitably at an order of 0.1 to 1. Further, it is unnecessary for the contact spacing on the source side to be the same as that on the drain side. As illustrated in FIG. 2, in order to raise drain breakdown voltage, it is permissible to adopt an asymmetric structure in which contact spacing on the drain side is enlarged and contact spacing on the source side is reduced in order to lower the source series resistance. Further, in a monolithic microwave integrated circuit (MMIC) serving as a multistage amplifying circuit that includes, e.g., first to intermediate stages, various structural conditions can be set appropriately so as to achieve a compromise between a low-noise characteristic and drain breakdown voltage.

First Exemplary Embodiment; Top Structure of Semiconductor Chip

Figure 3:
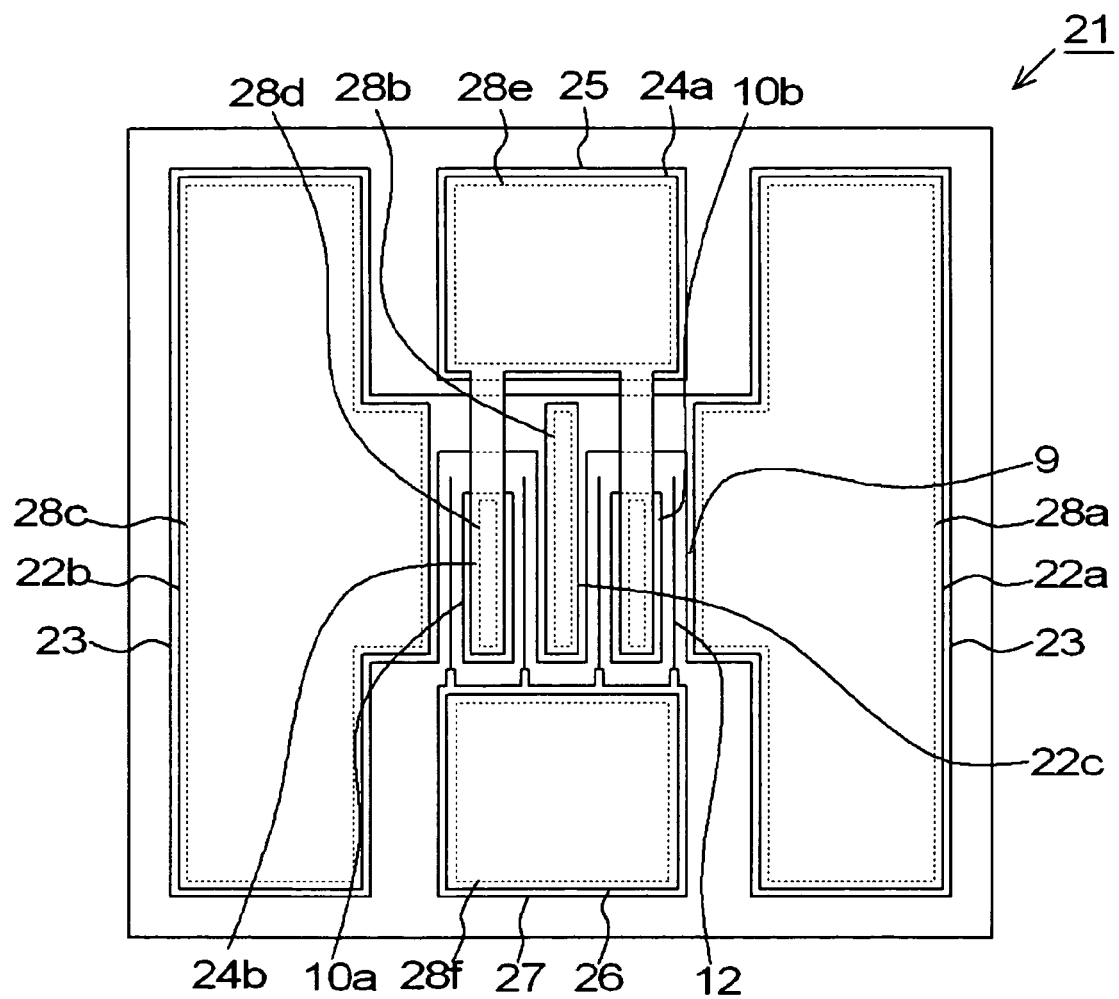
FIG. 3 is a top plan view of a semiconductor chip according to the first exemplary embodiment of the present invention.

Next, a semiconductor chip to which the FET 1 of the present invention has been applied will be described in detail. FIG. 3 is a top plan view, in general, of a semiconductor chip 21 equipped with the FET of the present invention. The semiconductor chip 21 has at least one FET, which is a basic element, provided on a semiconductor substrate. For example, the semiconductor chip 21 is an approximately 300 µm (=0.30 mm) square with a FET region placed at the center thereof.

In terms of the drawing, the semiconductor chip 21 has a gate pad 26, which serves as an input terminal, at bottom center, and gate wiring (gate-electrode pad) 27 as the underlying layer from which four gate electrodes 12 extend upwardly. The gate pad 26 is electrically connected to the gate wiring 27 via through-holes 28f provided in (through) an interlayer insulating film. Further, in terms of the drawings, provided at top center are a drain pad 24a serving as an output terminal, two drain wiring traces 24b extending downward from the drain pad, and drain electrodes 10a, 10b as the underlying layers. A drain electrode pad 25 underlies the drain pad 24a. The drain electrode pad 25 is formed at the same time as the drain electrode 10a. The drain wiring 24b and drain electrode 10a are electrically connected via through-holes 28b, and the drain pad 24a and drain electrode pad 25 are electrically connected via through-holes 28e. It should be noted that the drain electrode pad 25 is provided in order to assure intimate contact between the drain pad 24a and the semiconductor substrate. Further, in view of the drawings, source pads 22a to 22c serving as ground electrodes, the source electrode 9 as the underlying layer and source wiring (source electrode pad) 23 connected to the source electrode are provided at left, right and center. The source pads 22a to 22c are connected to the source wiring 23 via through-holes 28a to 28c. The source wiring 23 is formed with its left and right portions and its central portion connected. Further, the source pads 22a, 22b are formed with a large width in such a manner that they can be wire-bonded at a plurality of locations for the sake of grounding.

Figure 4:
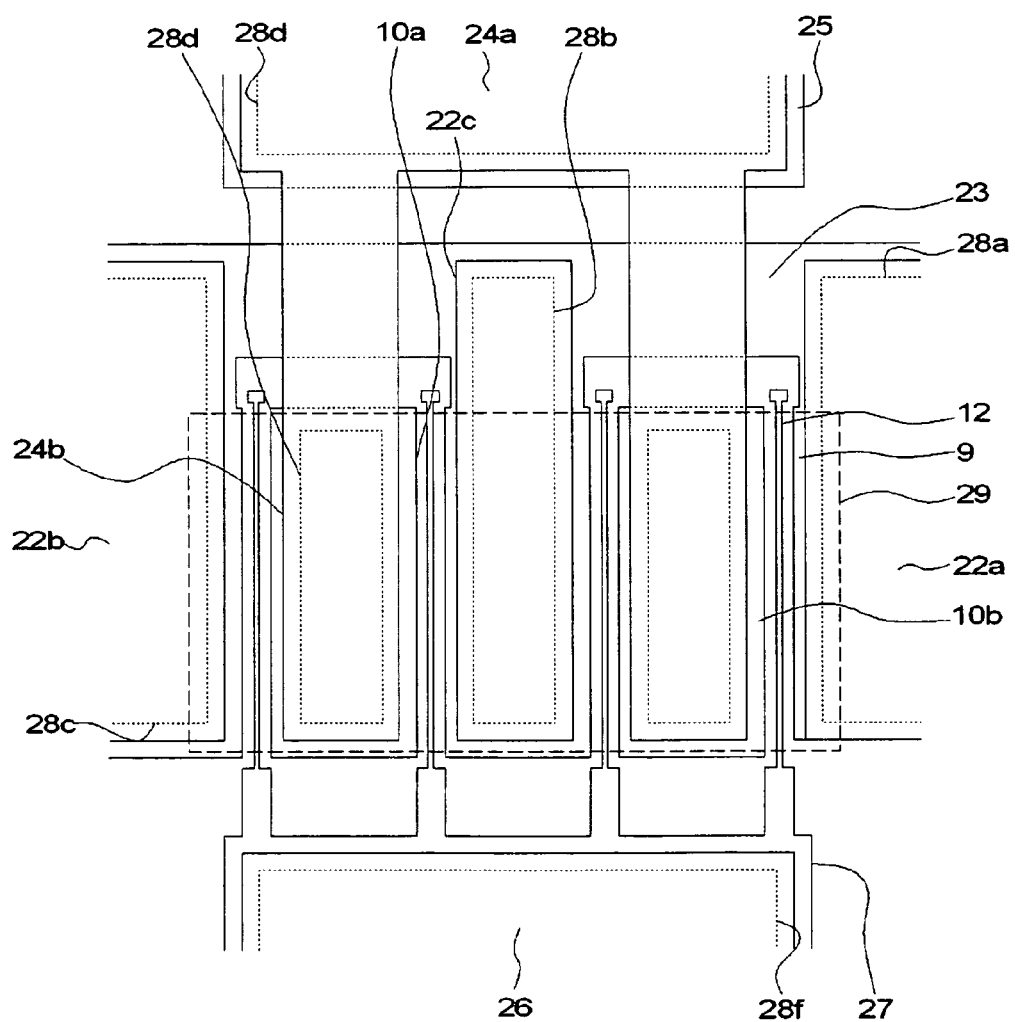
FIG. 4 is a partially enlarged view of a FET region at the center of the semiconductor chip shown in FIG. 3.
Figure 5:
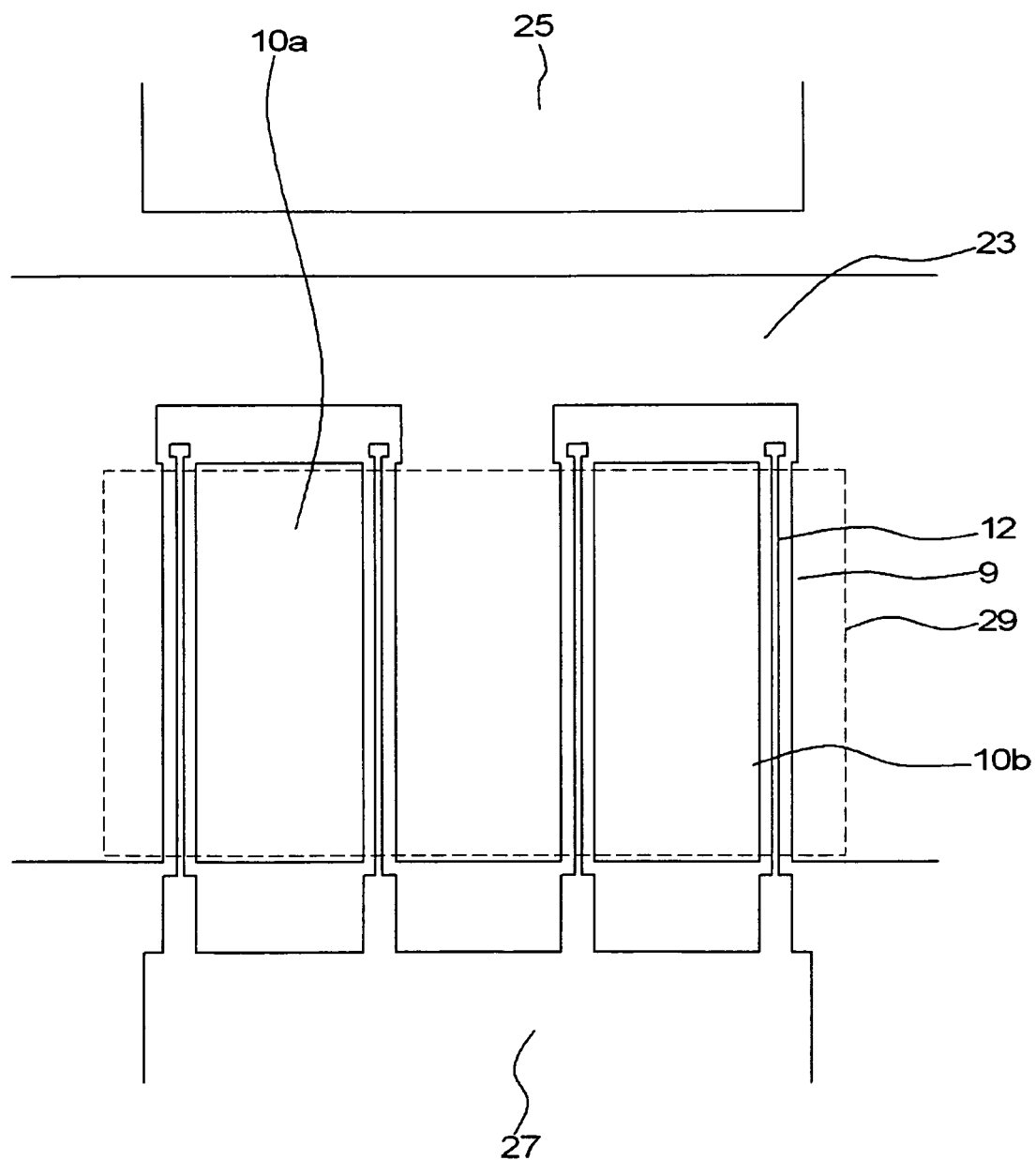
FIG. 5 is a partially enlarged view from which pads and through-holes in FIG. 4 have been deleted.

FIG. 4 is a partially enlarged sectional view of the FET region at the center of the semiconductor chip 21 shown in FIG. 3, and FIG. 5 is a partially enlarged view from which the pads and through-holes of the upper layer in FIG. 4 have been deleted from FIG. 4 in order to focus attention on the FET structure. An element region 29 serving as the FET region is shown in FIGS. 4 and 5. Here the source wiring 23, drain electrodes 10a, 10b, drain electrode pad 25, gate electrode 12 and gate wiring 27 are formed by a first wiring layer. The gate pad 26, source pads 22a to 22c, the drain pad 24a and the drain wiring 24b are formed by a second wiring layer.

An electrically conductive layer of a semiconductor grown epitaxially on a high-resistance semi-insulated semiconductor substrate is element-isolated into the shape of a rectangle by raising the resistance from the outer side. The result is the element region 29. An example of method of raising resistance is removal of the semiconductor layer by etching or obtaining a high resistance ascribable to defects produced by ion injection.

In FIG. 4, the drain electrodes 10a, 10b are situated below the two drain wiring traces 24b that make ohmic contact and extend from the drain pad 24a in such a manner that they cross the element region 29, and they are connected via the through-holes 28d. Further, the source wiring 23 connected to the source electrode 9 extends laterally so as to intersect the vertically extending drain wiring 24b and is formed in such a manner that the regions on both sides of the element region 29 will also be connected as the source electrode 9. The source wiring 23 is connected to the source pads 22a to 22c via the through-holes 28a, 28b, 28c. In order to lower resistance, the source pad (wiring) 22c is formed on the source wiring 23 (source electrode 9), which makes ohmic contact, between the two drain wiring traces 24b so as to cross the element region 29.

In this exemplary embodiment, wiring layers of small quantity are used as both the electrodes and wiring of the FET and therefore usage of terminology should be discussed further. Within the element region 29 of the FET, the lowermost wiring layer (the first wiring layer) shall be referred to as an "electrode". In an element isolation region outside the element region 29, it shall be referred to as "wiring". The portion connected to the electrode via the through-hole (via hole) and which is in the wiring layer (second wiring layer) on the lowermost wiring layer shall also be referred to as "wiring". The broad portion of the uppermost wiring layer shall be referred to as a "pad" and serves as a "terminal" for effecting a connection to the outside. The portion provided as the lowermost wiring layer (first wiring layer) the same as the electrode, and which has a similar shape on the lower side of the broad pad of the uppermost wiring layer (second wiring layer) shall be referred to as an "electrode pad".

In FIG. 5, the gate wiring 27 is formed between the source electrode 9 and the drain electrode 10b in such a manner that four slender (thin) wiring traces that will serve as the gate electrodes 12 cross the element region 29. The tips of the gate electrodes 12 are situated in the element isolation region outside the element region 29 and are enlarged (widened). In FIG. 5, the tips are rectangular (square) but may just as well be round. Further, the gate electrodes 12 may be broadened into a wedge shape (triangular shape) and enlarged at both ends of the element region 29. Further, the tips of the gate electrodes may end in the same lateral width without being enlarged. As for an example of dimensions of the gate electrodes 12, the length (gate width) of one gate electrode 12 in the element region 29 may be made 50 µm so that the total gate width of the four electrodes will be 200 µm.

In the gate electrodes 12, resistance to feed of current to the tips thereof will be reduced if the length of the gate electrodes 12 forming the gate width is made small. In order to maintain the total gate width, however, it will be necessary to increase the number of gate electrodes. As an example of a method of enlarging gate width, a plurality of linear gate electrodes are arranged in parallel, and either electrode of the source electrode and drain electrode is shared in two mutually adjacent FET constituent units among a plurality of FET constituent units. In this case, the element region 29 spreads in the lateral direction, the area of the wiring portion, etc., for feeding current to each gate electrode 12 is broadened and parasitic capacitance is enlarged. In order to assure high-frequency performance, therefore, the number of split gate electrodes 12 is adjusted. It should be noted that gate width, number of gate electrodes and chip dimensions are not limited by the foregoing description and can be adjusted appropriately in accordance with the application and the required performance.

A protective insulating film serving as both an interlayer insulating film and a protective film for the FET is formed between the gate pad 26, source pads 22a to 22c, drain pad 24a and drain wiring 24b, which constitute the second wiring layer, and the gate wiring 27, source wiring 23, drain electrode pad 25 and drain electrodes 10a, 10b constituting the first wiring layer. The first and second wiring layers are electrically connected by the through-holes 28a to 28f. The opening pattern of the through-holes 28a to 28f is formed to be somewhat smaller than the pattern of each pad and the pattern of each electrode. Further, although the wiring layer of the ohmic electrodes is used also as the first layer wiring, it is also possible to make use of the wiring layer of the gate electrode for this purpose. In this case, the first layer wiring and ohmic electrodes formed at the same time as the gate electrode are connected via the second layer wiring (second wiring layer).

The intersection of the drain wiring 24b of the second layer and the source wiring 23 of the first layer will be described. Parasitic capacitance where wiring crosses at the intersection is reduced by forming a thick low-dielectric-constant interlayer insulating film such as a polyimide resin film or BCB (benzocyclobutene) resin film or thick silicon oxide ($SiO_2$) film or by lifting the drain wiring 24b, which passes through the ohmic wiring, by an air bridge to form a hollow space on the lower side. The latter method, namely the form of the air-bridge wiring, will be described below.

Figure 6:
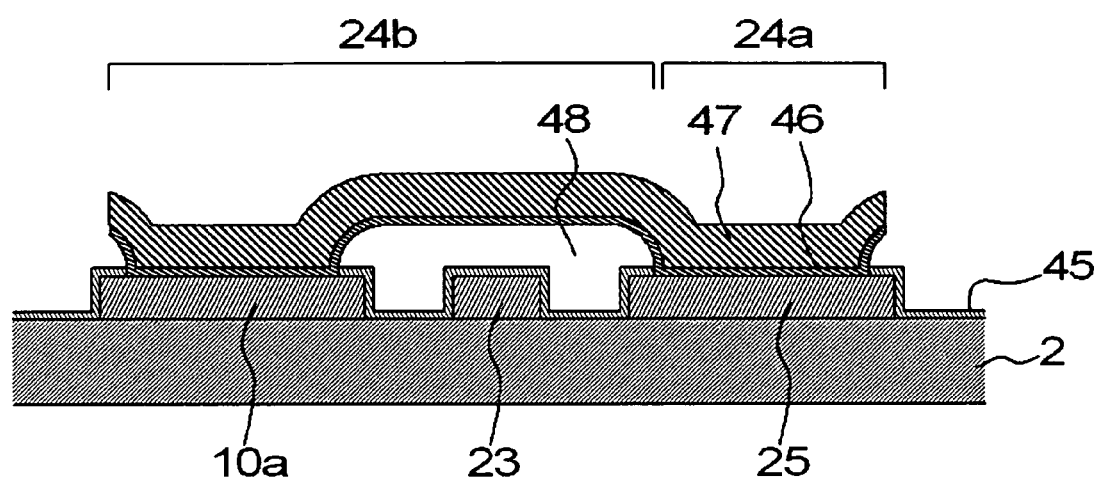
FIG. 6 is a sectional view of air-bridge wiring.

FIG. 6 is a sectional view of air-bridge wiring. This is a sectional view of the location where the drain wiring 24b is lifted producing a hollow space over the source wiring 23 that extends laterally in the top plan view of FIG. 4, and connecting the drain electrode 10a and drain electrode pad 25. The drain electrode 10a, source wiring 23 and large, square drain electrode pad 25 are formed as ohmic wiring (first layer wiring) on a semi-insulating GaAs substrate 2, and this is covered with a protective insulating film 45 such as silicon nitride (SiN). The ohmic wiring 10a, 23, 25 mainly is, e.g., gold (Au) with a thickness of 0.5 to 1 µm, and the thickness of the protective insulating film 45 can be made, e.g., 50 to 200 nm (=0.05 to 0.2 µm). The protective insulating film 45 over the drain electrode 10a is opened and the drain wiring 24b is connected. The protective insulating film 45 is opened also above the large, square drain electrode pad 25 and the large, square drain pad 24a is connected. The drain wiring 24b connected to the drain electrode 10a is lifted to a height of, e.g., 1 to 5 µm above the source wiring 23, forming a hollow space 48 below, so as to connect to the drain pad 24a. The drain wiring 24b and drain pad 24a are obtained by providing a low-resistance wiring metal film 47 such as gold (Au) to thickness of 0.5 to 5 µm. The air-bridge wiring is provided with the empty space by using a photoresist-film pattern beneath and finally removing the photoresist to form the empty space. Since the metal of the upper-layer wiring is subjected to etching above the photoresist-film pattern, a shape in which the edge protrudes upwardly is obtained. The protruding portion may be eliminated almost completely by raising the working precision. Further, although the first layer wiring below the air-bridge wiring is adopted as the source wiring 23, this may be wiring formed at the same time as the gate electrode.

Further, each wiring layer is not limited to Au; the wiring layers may be low-resistance metals such as aluminum (Al), copper (Cu) and nickel (Ni), etc. In order to prevent reaction between wiring layers as necessary, a barrier metal film 46 such as platinum (Pt), titanium nitride (TiN) or titanium silicide (TiSi) may be inserted as a ground coat to a thickness of several tens to several hundred nm. In particular, since an abnormal reaction tends to occur between wiring layers of Al and Au, such a barrier metal film is useful. For example, in order to cut down on use of expensive Au, it is possible to reduce the thickness of the ohmic wiring that includes Au and to deposit a thick low-resistance metal film such as inexpensive Al or Cu on this wiring via the barrier metal film.

The form and the effects of the air-bridge wiring in the FET will be described next. When the slender gate electrode 12 of the FET is used as a long gate Width, the gate series resistance increases and this worsens the noise figure NF. Feeding current upon splitting the gate electrode 12, therefore, is effective. Further, the FET has three terminals. If it is attempted to manufacture the FET with wiring in only two wiring layers, it is required that the wiring of some of these terminals be crossed. In a case where the gate electrode 12 or gate wiring 27 and source wiring 23 are made to intersect, even if the source wiring 23 be passed as the second layer wiring over the gate wiring 27, it is necessary to lengthen also the intersecting portion of the gate wiring 27 with respect to the source wiring 23 provided with a broad width in an effort to reduce resistance in order to achieve grounding, and the series resistance of the gate electrode 12 increases. On the other hand, if the thick drain wiring 24b be passed over the source wiring 23 by the air-bridge arrangement, etc., as in this exemplary embodiment, it is unnecessary to elongate the gate wiring 27 and the series resistance of the source electrode 9 and drain electrode 10 and the parasitic capacitance at the intersection are suppressed. It should be noted that in comparison with the pad wiring of the second layer wiring, the ohmic wiring of the first layer wiring is thin and exhibits a high sheet resistance. As a result, it is necessary to enlarge the width of the wiring and lower the resistance at the intersection.

With regard to the wiring structure of the FET shown in FIGS. 3 to 6, see the contents set forth in Patent Documents 4 and 5, whose disclosure are incorporated herein by reference. In this exemplary embodiment, it is so arranged that the electrodes and the wiring connected to them are made to serve a double purpose. However, this does not impose a limitation. Wiring layers accompanied by interlayer insulating films may be increased, through-holes (via holes) may be provided near the element region of the FET and the electrodes and wiring may be apportioned to different wiring layers.

Further, a semiconductor chip in which only a FET element is provided on a semiconductor substrate has been described in order to simplify the discussion. However, this does not impose a limitation; besides the FET element, a monolithic microwave integrated circuit (MMIC) serving as an amplifier circuit having resistors, capacitors, inductors, a distribution-constant line and a matching circuit etc. can be constructed on the semiconductor substrate. In the case of the amplifier circuit, a power-supply terminal is required, the power-supply terminal is provided on the opposite side opposing a ground terminal. That is, of the opposing source pads in the FET element, one is adopted as the ground terminal and the other one on the opposite side is adopted as the power-supply terminal. The power-supply terminal is connected to the drain electrode of the FET via a resistor or inductor serving as a load. A matching circuit or filter circuit composed of capacitors and resistors, etc., can be interposed between the input terminal and gate electrode or between the output terminal and the drain electrode. A bias resistor or a bypass capacitor can be interposed between the ground terminal and source electrode. Further, the amplifier circuit is not limited to a single stage; it can be made a multistage amplifier and a matching circuit or filter circuit can be interposed between the stages. In addition, a pad of a terminal for bias or for controlling changeover (switching) can be provided between the pads described thus far.

First Exemplary Embodiment; Detailed FET Cross-Sectional Structure

With regard to the cross-sectional structure of the FET according to the first exemplary embodiment shown in FIG. 1, an optimum example will be described in concrete terms. Also described in simple terms will be a method of manufacturing the structural elements of the FET. First, the thickness of the high-resistance semi-insulating GaAs substrate 2 is made 50 to 200 μm, by way of example. This thickness is obtained by thinning a substrate having a thickness of e.g., about 600 μm by polishing the underside at the end of the manufacturing process. In the GaAs substrate 2, a slight amount of As is donated excessively. In order to cancel this out, about $1 \times 10^{15}$ cm$^{-3}$ of carbon is added as a p-type impurity (acceptor) and a semi-insulating property is attained by a high resistance having a bulk resistivity on the order of $10^7$ Ωcm. Further, the LEC (Liquid Encapsulated Czochralski) growth method, VGF (Vertical Gradient Freeze) growth method or VB (Vertical Boat) growth method, etc., can be employed for the semi-insulating GaAs substrate 2.

Next, the semiconductor layers up to the n-type InGaP layer 6 are grown epitaxially on the surface of the semi-insulating GaAs substrate 2. Molecular beam epitaxy (MBE) or metal organic vapor-phase epitaxy (MOVPE) is used as the growth method. A steep hetero-interface is readily obtained with the MBE method. With the MOVPE method, on the other hand, productivity is excellent because the number of devices obtained in a batch subjected to growth a single time can be set to a large value.

An optimum example of an epitaxial-growth layer will be set forth below. The i-type GaAs layer 3 serving as the buffer layer has no carrier impurities added to it (it is undoped) and has a thickness of about 500 nm. The i-type InGaAs layer 4 serving as the two-dimensional electron gas layer has an In composition in Group III elements (atomic ratio) on the order of 0.15 to 0.25 and a thickness of 13 nm. The n-type AlGaAs layer 5 serving as the electron supply layer has an Al composition in Group III elements on the order of 0.15 to 0.25, a thickness of 33 nm, is doped with n-type carrier impurity Si and has a carrier concentration of $2.5 \times 10^{18}$ cm$^{-3}$. The n-type InGaP layer 6 serving as the etching stop layer has an In composition in Group III elements on the order of 0.45 to 0.55, a thickness of 10 nm, is doped with n-type carrier impurity Si and has a carrier concentration of $4.0 \times 10^{18}$ cm$^{-3}$. The n-type GaAs layer 7 serving as the contact layer has a thickness of 100 nm, is doped with n-type carrier impurity Si and has a carrier concentration of $4.0 \times 10^{18}$ cm$^{-3}$.

With regard to the arrangement of these semiconductor layers such as the i-type InGaAs layer 4 serving as the two-dimensional electron gas layer, see the content set forth in Patent Document 2 and Non-Patent Document 1, whose disclosure are incorporated herein by reference. Adjustment of the FET characteristic can be carried out mainly by changing the carrier concentration and thickness of the n-type AlGaAs layer 5 serving as the electron supply layer. The thickness and element composition of each layer of the semiconductor crystal layers built up by growth can be measured by an X-ray diffraction apparatus. The carrier concentrations of the n-type semiconductor layers are found by growing an electrically conductive semiconductor layer to a certain degree of thickness and measuring sheet resistance by the Hall-effect method or overcurrent method, and the doping conditions of epitaxial growth can be corrected.

The thickness of the n-type InGaP layer 6 serving as the wet-etching stop layer can be set to 2 to 20 nm, by way of example. Since this layer is reflected in the source series resistance as a heterobarrier, it is better if this layer is thin. On the other hand, if the thickness is increased to about 20 nm, the function of the etching stop layer is enhanced.

The thickness of the n-type GaAs layer 7 serving as the contact layer can be set appropriately to 50 to 500 nm and can be made about 100 nm, by way of example. Further, the n-type carrier impurity Si is selected because it is not readily diffused by heat.

The gate electrode 12 is formed on the n-type AlGaAs layer 5 serving as the electron supply layer. By way of example, the gate electrode 12 has a T-shaped configuration in which the gate length of small lateral width where contact is made with the n-type AlGaAs layer 5 is about 0.2 μm, and which has a portion by 0.3 to 1 μm above that widened to a lateral width of 0.5 to 2 μm. The thickness of the metal at this widened portion is 0.3 to 1 μm. Further, in order to assure reliability, a heat-resistant metal besides titanium (Ti), such as vanadium (V), chrome (Cr), zirconium (Zr), niobium (Nb), molybdenum (Mo), hafnium (Hf), tantalum (Ta) or tungsten (W), a silicide thereof (e.g., TiSi) or a nitride thereof (TiN) is provided to a small thickness of 20 to 60 nm as the Schottky metal layer 11 that contacts the n-type AlGaAs layer 5. A low-resistance metal such as aluminum (Al) or nickel (Ni) is built up on this layer to a thickness of 300 to 1000 nm (=0.3 to 1 μm). In order to protect the gate electrode 12, a film identical with the Schottky metal layer 11 is provided on this layer to a small thickness of 20 to 100 nm, approximately.

Figure 7:
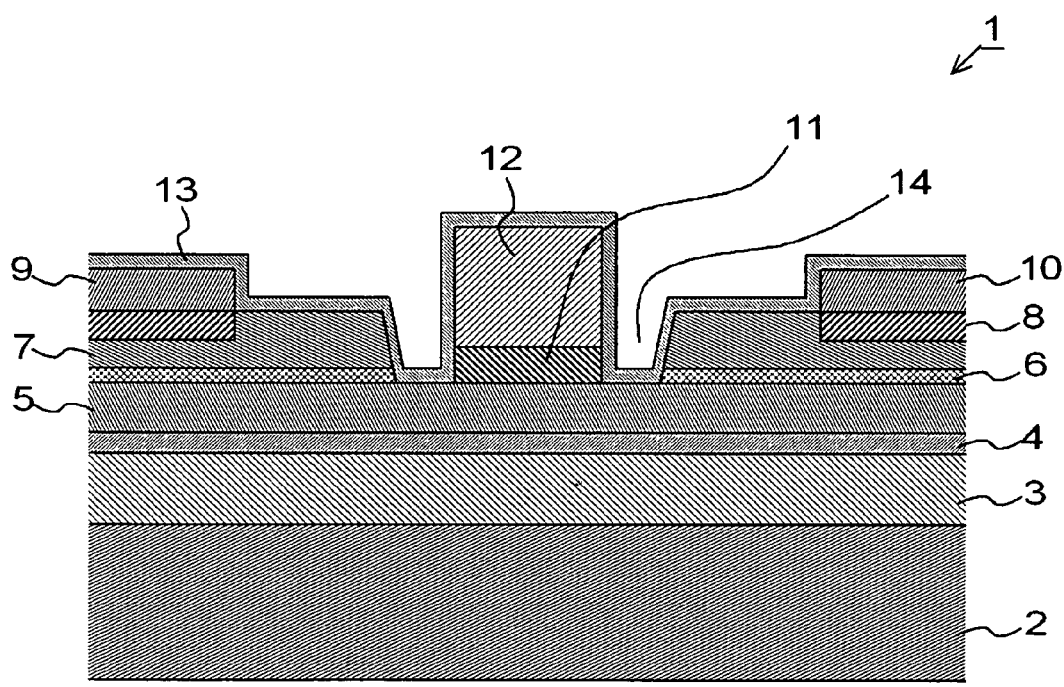
FIG. 7 is a sectional view illustrating another variant of a field-effect transistor according to the first exemplary embodiment of the present invention.
Figure 8:
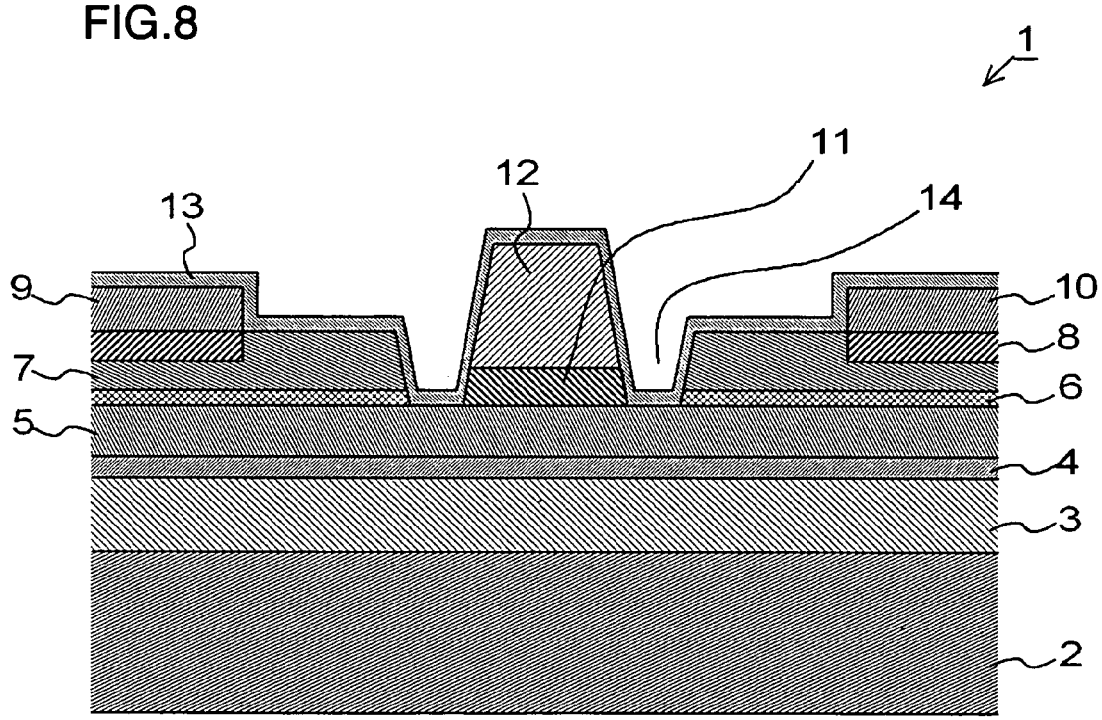
FIG. 8 is a sectional view illustrating still a further variant of a field-effect transistor according to the first exemplary embodiment of the present invention.

Gold (Au) or copper (Cu), etc., can be used as the gate wiring layer. In order to prevent these metals from being thermally diffused into the semiconductor layers, it is preferred that platinum (Pt), titanium nitride (TiN) of titanium silicide (TiSi), etc., be inserted as a barrier metal film to a thickness of several tens to several hundred nm. Further, it is possible to adopt TiN or TiSi, etc., which exhibits the diffusion-barrier property, directly as the Schottky metal layer 11, as mentioned above. Further, in the general-purpose case in which gate length is 0.5 μm or greater, the cross-sectional shape of the gate electrode 12 need not have the T-shaped configuration of FIG. 1. The gate electrode 12 may have the shape of a simple rectangle (square) of the kind shown in FIG. 7 or the shape of a trapezoid of the kind shown in FIG. 8.

The n-type InGaP layer 6 serving as the etching stop layer and the n-type GaAs layer 7 serving as the contact layer are provided at a distance of about 0.10 μm or more from the bottom of the gate electrode 12. As mentioned above, the contact spacing is related to the breakdown voltage, mutual conductance gm and drain conductance gd of the FET characteristics and to the minimum noise figure NFmin and associated gain Ga, etc. Further, contact spacing on the side of the drain electrode 10 need not be the substantially same (or similar) as contact spacing on the side of the source electrode 9, and by enlarging it on the drain electrode side, as shown in FIG. 2, drain breakdown voltage can be raised.

The source electrode 9 and drain electrode 10 serving as the ohmic electrodes are formed above the n-type GaAs layer 7, which serves as a contact layer, at a distance of, e.g., 1 to 3 μm from the gate electrode 12. Ohmic contact causes gold (Au), germanium (Ge) and nickel (Ni) to alloy and diffuse into the n-type GaAs layer 7. Further, it is preferred that the ohmic alloy layer 8 that is the result of this alloy diffusion halt at a depth inside the n-type GaAs layer 7 serving as the contact layer. If alloy diffusion reaches the underlying n-type AlGaAs layer 5, the Au and Al react, ohmic contact deteriorates and contact resistance increases.

An example of an ohmic contact electrode with respect to the n-type GaAs layer will be described. The minimum ohmic electrode should have Ge as a donor source with respect to n-type GaAs, and a metal film for affording intimate contact by suppressing coagulation of the Ge and for assuring electrical conductivity as an electrode. As for the metal film, Ni exhibits excellent wettability with respect to Ge and diffuses into the GaAs gradually and generally is used for this reason. However, the temperature at which Ge diffuses into GaAs is a high 500 to 600 degrees C., which is close to the temperature of epitaxial growth of the semiconductor layers. As this tends to readily affect heterojunction of the semiconductor layers, managing manufacture is difficult. A measure for dealing with this is to add Au to the Ge. Since the Au is a source of diffusion into the GaAs and an alloy reaction occurs at 350 to 450 degrees C., this measure is generally employed. However, when the alloy reaction starts, the Au suddenly diffuses deeply into the GaAs in spike fashion via a portion of weak crystallinity, such as the dislocation surface of the GaAs. Consequently, managing the alloying thermal treatment was difficult.

A method of forming ohmic contact in which such a sudden alloy reaction is suppressed is described in Patent Document 6, whose disclosure is incorporated herein by reference. First, Ni is deposited to a very small thickness of several nm on a GaAs surface. Since the Ni is island-shaped and not a flat film, the Ni serves as a net mask to suppress the sudden diffusion of Au and afford uniform diffusion, resulting in a shallow alloy layer. This patent document states that with the thickness of the alloy layer at 25 nm, a contact resistivity having a low value of about 0.4 μΩcm$^2$ is obtained. Further, contact resistance with respect to an n-type GaAs layer having a thickness of 100 nm in the example of this exemplary embodiment is low and excellent, about 0.05 Ωmm at a unit width of 1 mm. In the example of this exemplary embodiment, first Ni, Ge and Au are deposited to thicknesses of several nm, several tens of nm and several hundred nm, respectively, after which heating at 350 to 450 degrees C. for several tens of seconds to several minutes is applied as an alloying thermal treatment to obtain an alloy-layer thickness of 30 nm. In another example, in order to cut down on use of expensive Au, first Ni, Ge, Au and Ni are deposited to thicknesses of several nm, several tens of nm, several tens of nm and several hundred nm, respectively, after which the thermal treatment is applied.

Further, since the ohmic electrode serves also as the first layer wiring, Au is built up to a thick 500 to 1000 nm (=0.5 to 1.0 μm). The ohmic electrode serving also as the first layer wiring requires height in order to lower the wiring resistance. Further, in order to cut down on use of expensive Au, it is possible to thin the ohmic wiring that includes Au, insert a barrier metal film such as Pt, TiN or TiSi over the ohmic wiring to a thickness of several tens to several hundred nm and deposit a low-resistance metal film such as inexpensive Al or Cu to a large thickness, as described above in regard to the top plan-view structure.

In order to protect the semiconductor surface and each electrode, the protective insulating film 13 employs a film of silicon nitride (SiN film), a film of aluminum nitride (AlN film), a film of boron nitride (BN film) or film of silicon oxide (SiO$_2$ film), etc. The thickness of the protective insulating film 13 is a thin 50 to 200 nm. Methods of film formation that can be used are plasma chemical vapor deposition (plasma CVD) and catalytic chemical vapor deposition (Cat-CVD).

First Exemplary Embodiment; FET Characteristics and Effects

The electrical characteristics of a FET according to the first exemplary embodiment were measured. In manufacture, use was made of 30 wafers grown by MBE. The gate length of the FET element was about 0.20 μm and the overall gate width was 200 μm. The average gate threshold voltage Vt of the manufactured FET was about −0.9 V, and the standard deviation value σ thereof was about 60 mV, this being within a range of ±180 mV for 3 σ, exhibiting good uniformity.

As an example for purpose of comparison, a FET was formed to have a gate recess dug by wet etching with an n-type AlGaAs layer, which serves as an electron supply layer, formed to a thickness of 40 nm and having the same carrier concentration without the inclusion of an n-type InGaP layer serving as an etching stop layer. In the case of this FET, the recess was adjusted while monitoring the current value. As a result, the gate threshold voltage Vt took on a broad distribution so as to include the distribution of this exemplary embodiment.

These FET chips were cut from each wafer, assembled into a molded resin package according to a sixth exemplary embodiment, described later, and the electrical characteristics were measured. As for the bias conditions, drain voltage Vds and drain current Ids were 2.0 V and 10 mA, respectively. Cut-off frequency ft and maximum oscillation frequency fmax in the first exemplary embodiment were 71 GHz and 101 GHz, respectively. Minimum noise figure NFmin measured at 12 GHz was 0.37 dB and the associated gain Ga at this time was 12.7 dB. With regard to the correlation of these characteristic values, it was found that if the distribution of the first exemplary embodiment is viewed upon being superimposed on various distributions of comparison examples that include the gate threshold value Vt, the distribution of the first exemplary embodiment is situated as a narrow distribution within the distribution of the comparison examples and has substantially equivalent characteristics with improved uniformity. It can be understood from this that the FET of the present invention exhibits good in-place uniformity and excellent reproducibility.

Considered next will be dependence on the spacing (contact spacing) between the gate electrode 12 (Schottky metal layer 11) and contact layer 7 (etching stop layer 6) at the bottom (of recess). The contact spacing is dependent upon the etching time and becomes larger as side etching proceeds. As for saturation of drain current with respect to drain voltage, a contact spacing larger than 0.10 μm results in better saturation of the drain current. If the contact spacing is less than 0.10 μm, e.g., 0.05 to 0.08 μm, saturation of the drain current becomes non-uniform and deteriorates and there is large variation in drain current Idss at a gate voltage Vgs of 0 V. When saturation of drain current deteriorates, i.e., when drain conductance gd increases, power gain and maximum oscillation frequency fmax decline. Minimum noise figure NFmin and associated gain Ga at a contact spacing of 0.15 μm were 0.37 dB and 12.7 dB, respectively. When the contact spacing was less than 0.10 μm, better values of 0.35 dB and 12.9 dB were obtained. When contact spacing was reduced further, the values became 0.35 dB and 11.3 dB and associated gain Ga declined. On the other hand, when contact spacing was enlarged to 0.27 μm, the values obtained were 0.40 dB and 12.1 dB. When contact spacing was made 0.36 μm, the values obtained were 0.46 dB and 11.5 dB, NFmin increased and associated gain Ga slowly declined.

With regard to dependence between contact spacing and source resistance Rs, the values obtained were as follows: 1.9 Ω at 0.07 μm, 2.0 Ω at 0.10 μm, 2.0 Ω at 0.15 μm, 2.3 Ω at 0.27 μm, and 2.8 Ω at 0.36 μm. When contact spacing was changed from 0.07 μm to 0.27 μm, Rs changed slightly from 1.9 Ω to 2.3 Ω. It is assumed that since current flows from the n-type GaAs contact layer into the n-type AlGaAs electron supply layer, the dependence on the contact spacing diminishes. Source resistance was about 2.0 Ω in a case where there was no inclusion of an InGaP etching stop layer in the comparison examples. Since the InGaP layer serving as the etching stop layer is provided as a thin layer of 10 nm, there is almost no influence upon source resistance. As for the source resistance 2.0 Ω as a value at a unit width of 1 mm, gate width is 200 μm (=0.2 mm) and therefore the value is 0.4 Ωmm at a unit width of 1 mm. On the other hand, when the InGaP layer is on the order of 20 nm, a slight increase in contact resistance and source resistance is confirmed but the effect on amplification performance and high-frequency performance is still small.

In a case where the carrier concentration of the n-type AlGaAs layer serving as the electron supply layer is made $2.5 \times 10^{18}$ cm$^{-3}$, drain breakdown voltage on the order of 4 to 7 V at a contact spacing of an order of 0.1 to 0.2 μm which is allowable for low-noise application in first-stage amplification. If contact spacing is enlarged to the order of 0.5 μm, the high-frequency performance of power gain gradually declines but drain breakdown voltage is improved to above 10 V. As a result, provision for general-purpose amplification (intermediate-stage amplification) is possible. Further, if the carrier concentration of the n-type AlGaAs layer serving as the electron supply layer is lowered to the order of $(0.5$ to $2) \times 10^{18}$ cm$^{-3}$, the gate length is enlarged to the order of 0.3 to 1 μm and contact spacing is enlarged to the order of 0.5 to 1 μm, then the drain breakdown voltage can be raised to the order of 20 to 30 V. In particular, if gate length is enlarged, then drain conductance gd at saturation of the drain current diminishes and power gain and power efficiency can be assured in relation to maximum oscillation frequency fmax. If gate length becomes 0.5 μm or larger, the cross section of the gate electrode need no longer have the T-shaped configuration (see FIG. 1) and the simple rectangular shape (FIG. 7) or trapezoidal shape (FIG. 8) will suffice. Further, if the carrier concentration of the n-type AlGaAs layer serving as the electron supply layer is lowered, then, in order to mitigate concentration of electric field, the carrier concentration of the n-type InGaP layer serving as the etching stop layer may also be lowered and the n-type GaAs layer serving as the adjacent contact layer may have its carrier concentration varied in step-wise or slope fashion near the n-type InGaP layer. These requirements for constructing the FET can be set appropriately in accordance with the applied uses and required specifications.

Further, contact spacing is set symmetrical (FIG. 1), i.e., the same on the source and drain sides, assuming side etching (undercut) from the gate opening. However, the invention is not limited to this symmetrical arrangement and the asymmetric arrangement shown in FIG. 2 may be adopted. This is possible by working the contact region and separately providing the photoresist film pattern of the gate opening. For example, by reducing the contact spacing on the source side to the order of 0.1 to 0.3 μm, source series resistance is reduced, and by enlarging contact spacing on the drain side to the order of 0.2 to 2 μm, drain breakdown voltage is increased.

Figure 9:
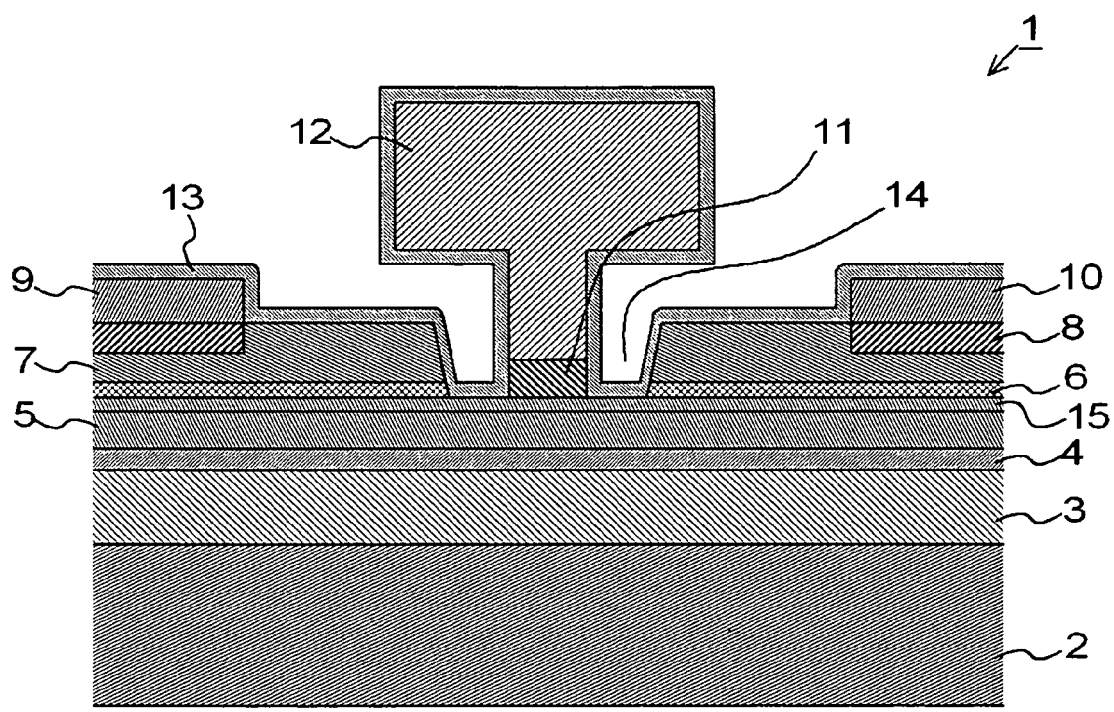
FIG. 9 is a sectional view illustrating still a further variant of a field-effect transistor according to the first exemplary embodiment of the present invention.

In addition, as shown in FIG. 9 in order to raise the gate reverse-breakdown voltage, the surface of the n-type AlGaAs layer 5 serving as the electron supply layer that touches the gate electrode 12 (Schottky metal layer 11) may be provided as a Schottky layer 15 with a small thickness of the order of 3 to 30 nm in undoped form (i-type) or as the p-type. Since the Schottky layer 15 is formed by the initial epitaxial growth, it is situated beneath the n-type GaAs layer 7 serving as the contact layer and the n-type InGaP layer 6 serving as the etching stop layer. As a result, the i- or p-type Schottky layer 15 acts as a barrier against flow of electrons in the form of drain current, raises the contact resistance and enlarges the source series resistance. Accordingly, it cannot be made very thick. On the other hand, with respect to the gate electrode, the i- or p-type Schottky layer 15 enhances the barrier property and raises gate reverse-breakdown voltage. The thickness to which insertion is possible is limited owing to influence upon the source series resistance, and the improvement in the gate reverse-breakdown voltage is limited. However, it is useful in raising the gate reverse-breakdown voltage besides raising the drain breakdown voltage.

Further, in a case where the n-type InGaP layer 6 serving as the etching stop layer is etched away by dilute hydrochloric acid, the AlGaAs layer serving as the Schottky layer 15 acts as a stop layer and is exposed and remains in the contact spacing at the sides of the gate electrode. This surface is covered with the protective insulating film 13 of SiN or the like. The Schottky layer 15 present in the contact spacing has the effect of isolating and weakening the effect of the channel, in which current flows as drain current, from the defect level (trap) produced at the interface with the protective insulating film 13.

Further, with a theoretical FET, drain current Ids varies as a second-power characteristic in accordance with the gate voltage Vgs, and mutual conductance gm, which is obtained by differentiating this variation, increases in proportion to Vgs (according to a first-power characteristic). On the other hand, with the FET of the present invention, in a case where the gate voltage Vgs is varied to the positive side from cut-off on the negative side, gm increases sharply owing to the effect of two-dimensional electron gas if the gate threshold voltage Vt is exceeded. With Vgs in the vicinity of 0 V, the drain current Ids flows also in (through) the n-type AlGaAs layer serving as the electron supply layer and acts as a channel. At this time (Vgs in the vicinity of 0 V), the surface depletion layer widens in the contact spacing on the sides of the gate electrode and an increase in drain current Ids is suppressed. Therefore, gm becomes substantially constant with respect to Vgs or decreases gradually. An amplification characteristic in which gm becomes substantially constant after gm increases sharply owing to the effect of the two-dimensional electron gas in the vicinity of Vt at cut-off is desirable for an analog amplification element that requires linear amplification with a constant gm.

First Exemplary Embodiment; Method of Manufacturing FET)

Next, a method of manufacturing a FET according to an exemplary embodiment of the present invention will be described. FIGS. 10A to 10H are sectional views useful in describing basic steps up to formation of FET electrodes as a method of manufacturing the FET (FIG. 1) according to the first exemplary embodiment. Although the FET shown in FIGS. 10A to 10H has portions that differ in terms of particulars from those of the FET shown in the sectional view of FIG. 1, there is no intent to show an absence of correlation with regard to the FET shown in FIG. 1 and the FET illustrated in FIGS. 10A to 10H. Further, the numerical values of the conditions represent one example and the invention is not limited to these values.

Figure 10A:
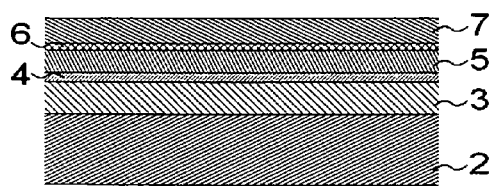
FIGS. 10A to 10H are process diagrams for describing a method of manufacturing a field-effect transistor according to an exemplary embodiment of the present invention.

First, the i-type GaAs layer 3 (thickness: 500 nm) serving as the buffer layer, the i-type InGaAs layer 4 (thickness: 13 nm) serving as the two-dimensional electron gas layer, the n-type AlGaAs layer 5 (thickness: 33 nm) serving as the electron supply layer, the n-type InGaP layer 6 (thickness: 10 nm) serving as the etching stop layer and the n-type GaAs layer 7 (thickness: 100 nm) serving as the contact layer are grown epitaxially on the semi-insulating GaAs substrate 2 (FIG. 10A).

Next, in order to form the element region 29 illustrated in the top plan views of FIGS. 4 and 5, high-resistance element isolation is carried out (not shown). Methods of performing element isolation that can be used include etching away the electrically conductive layer (mesa etching) or raising resistance by defects produced in ion injection. In the case of removal of the electrically conductive layer by etching (mesa etching), the element region is covered with a photoresist film and the i-type GaAs layer 3 is etched down part of the way, e.g., to a depth of an order of 200 to 300 nm. A sulfuric acid—hydrogen peroxide solution of sulfuric acid, hydrogen peroxide solution and water is used as the etching solution. When etching has been stopped by the n-type InGaP layer 6, this layer is removed by diluted hydrochloric acid and etching using the sulfuric acid—hydrogen peroxide solution is continued again. On the other hand, in the case where resistance is raised by ion injection, the element region 29 is covered with a thick photoresist film having a thickness of 2 to 4 μm, and element ions such as helium ($^4He^+$), boron ($^{11}B^+$), nitrogen ($^{14}N^+$) or oxygen ($^{16}O^+$) are injected at an acceleration energy of 100 to 300 keV and injection dose of $1\times10^{12}$ to $1\times10^{14}$ cm$^{-2}$, thereby producing defects in the semiconductor layer. At this acceleration energy, the ions reach a depth of from the midway along the i-type GaAs layer 3 to the semi-insulating GaAs substrate 2. The smaller the mass indicated at the upper left of the element symbol, the deeper the ion is to be injected. The rise in resistance results not from the impurity but from the defect in the crystal. Further, a plurality of elements having different masses may be combined.

Figure 10B:
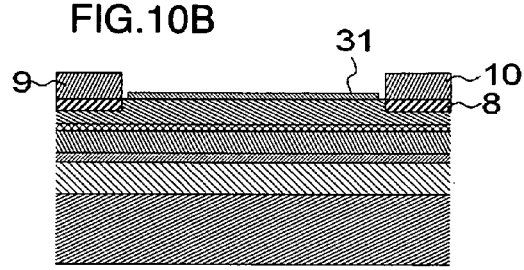

Next, the photoresist film used in element isolation is removed and a silicon oxide film (SiO$_2$ film) 31 having a thickness of an order of 30 to 100 nm is formed on the surface of the semiconductor substrate in order to protect the surface. A photoresist film having a thickness of 2 to 3 μm and openings (not shown) for ohmic electrodes are formed on the surface. Next, the silicon oxide film 31 exposed in this opening is opened by being dissolved by a buffered fluoric acid solution. Next, as ohmic contacts of the source electrode 9 and drain electrode 10, Ni, Ge and Au are deposited by vapor deposition to a thicknesses of approximately 2 to 6 nm, 5 to 20 nm and 500 to 1000 nm (=0.5 to 1.0 μm), respectively. Next, excess metal film on the photoresist film is removed by a lift-off treatment in organic solvent. Next, a thermal treatment is performed in nitrogen at 350 to 450 degrees C. for several tens of seconds to several minutes to thereby perform an ohmic-contact alloying treatment. As a result, the source electrode 9 and drain electrode 10 are formed on the ohmic alloy layer 8 and n-type GaAs layer 7 and, at the same time, so are the source wiring 23 as the first layer wiring and the drain electrode pad 25 illustrated in the top plan views of FIGS. 3 to 5 (FIG. 10B). The spacing between the source electrode 9 and drain electrode 10 is 3 to 6 μm, approximately.

Another form of ohmic contact will be exemplified. In this example, in which the Au used is reduced, Ni, Ge, Au and Ni are deposited to thicknesses of 2 to 6 nm, 5 to 20 nm, 10 to 50 nm and 100 to 500 nm, respectively, and a thermal treatment is performed in nitrogen at 350 to 450 degrees C. for several tens of seconds to several minutes. As a case in which no Au is used, Ni, Ge and Ni are deposited to thicknesses of 2 to 6 nm, 10 to 50 nm and 100 to 500 nm, respectively, after which a heat treatment is performed in an instantaneously overheated lamp furnace or the like in an atmosphere of nitrogen, helium, argon or hydrogen, etc., at 500 to 700 degrees C. for a short time of several seconds to several tens of seconds.

Figure 10C:
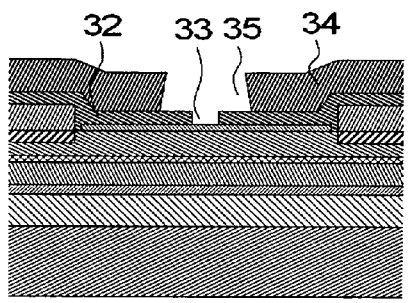

Next, in order to form the gate electrode 12 and gate wiring 27, which are shown in the top plan views of FIGS. 3 to 5, between the source electrode 9 and drain electrode 10, a photoresist film for lift-off formation is formed (FIG. 10C). The photoresist film has two layers. A first photoresist film 32 at the lower layer has a thickness of 0.1 to 1 μm and has a gate opening 33 whose lateral width, which becomes the gate length, is about 0.20 μm (=200 nm). A second photoresist film 34 at the upper layer has a thickness of 1 to 3 μm and has a wiring opening 35 whose lateral width, which becomes the wiring portion, is 0.5 to 2 μm.

Figure 10D:
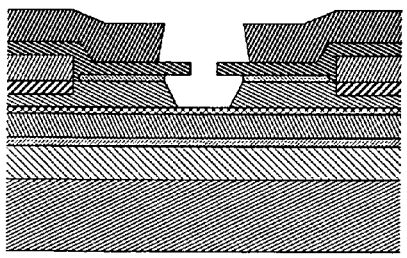

Next, from the gate opening 33 of the first photoresist film 32, the silicon oxide film 31 and n-type GaAs layer 7 are selectively etched up to the n-type InGaP layer 6 serving as the etching stop layer (FIG. 10D). First, the silicon oxide film 31 exposed in the gate opening 33 is side-etched by about 0.10 μm in the lateral direction by a buffered fluoric acid solution. Next, the n-type GaAs layer 7 is selectively side-etched by about 0.05 μm from the silicon oxide film 31 in the lateral direction using a sulfuric acid—hydrogen peroxide solution. Side etching accompanied by an etching stop layer can be implemented with excellent controllability and reproducibility, which is based upon etching time, by managing the composition and temperature of the etching solution so as to remain constant. It is assumed that this is because there is a trace amount of etching within the slender gap.

Figure 10E:
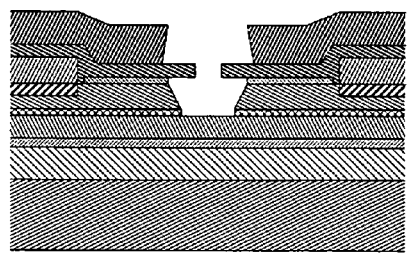

Next, the exposed n-type InGaP layer 6 is etched way using diluted hydrochloric acid (FIG. 10E). By diluting the hydrochloric acid, the etching of the thin n-type InGaP layer 6 stops at the lateral position alongside the n-type GaAs layer 7, which is disposed on the upper layer, and almost no side etching of the thin layer 6 occurs even if etching of the thin layer 6 is performed for a slightly long period of time.

Figure 10F:
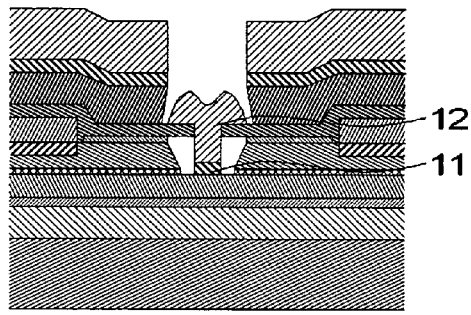

Next, the Schottky metal layer 11 and gate electrode 12 are vapor-deposited in a vacuum evaporation apparatus (FIG. 10F). Titanium (Ti) is deposited to a thickness of 20 to 60 nm as the Schottky metal layer 11, and aluminum (Al) is deposited to a thickness of 300 to 1000 nm (=0.3 to 1 μm) as the gate electrode 12. A film of a Schottky metal for protecting the gate electrode 12 provided thinly thereon to a thickness of 20 to 100 nm. An electron gun (E-gun) or sputtering can be used in the vacuum evaporation apparatus. Besides titanium (Ti), a high-melting-point metal such as vanadium (V), chrome (Cr), zirconium (Zr), niobium (Nb), molybdenum (Mo), hafnium (Hf), tantalum (Ta) and/or tungsten (W) etc. can be used as the Schottky metal layer 11. Further, in a case where sputtering is used, a silicide film obtained by adding silicon to each metal or a nitride film obtained by adding nitrogen to each metal may be used. Further, Al in sputtering may contain Si or Cu up to several percents.

Figure 10G:
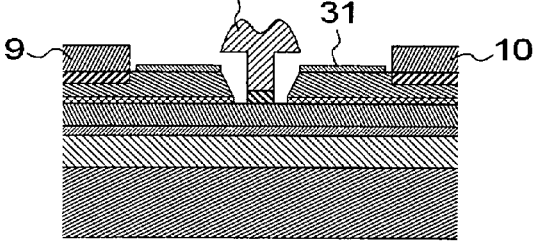

Next, a lift-off treatment is performed with emersion in an organic solvent and the gate electrode 12 is exposed (FIG. 10G). The bottom of the gate electrode 12 formed is about 0.20 μm. Further, the silicon oxide film 31, which was used as the surface protection layer in electrode formation, remains on the n-type GaAs layer 7 on both sides of the gate electrode 12. In the top plan view of FIG. 5, the silicon oxide film 31 remains also on the semiconductor surface, which is devoid of electrodes and wirings, in the element isolation region on the outer side of the element region 29.

Figure 10H:
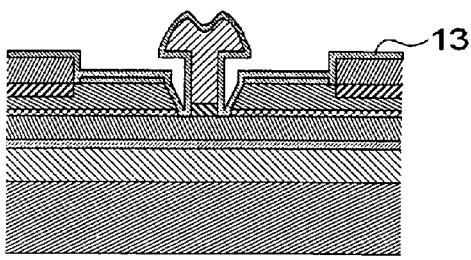

Next, a silicon nitride film (SiN film), aluminum nitride film (AlN film), boron nitride film (BN film) or silicon oxide film ($SiO_2$ film), etc., is thinly deposited on the surface to a thickness of 50 to 200 nm as the protective insulating film 13 (FIG. 10H). Plasma chemical vapor deposition (plasma CVD) or catalytic chemical vapor deposition (Cat-CVD), etc., can be used to achieve this deposition. The foundation of the FET of the present invention can thus be formed.

Figure 11:
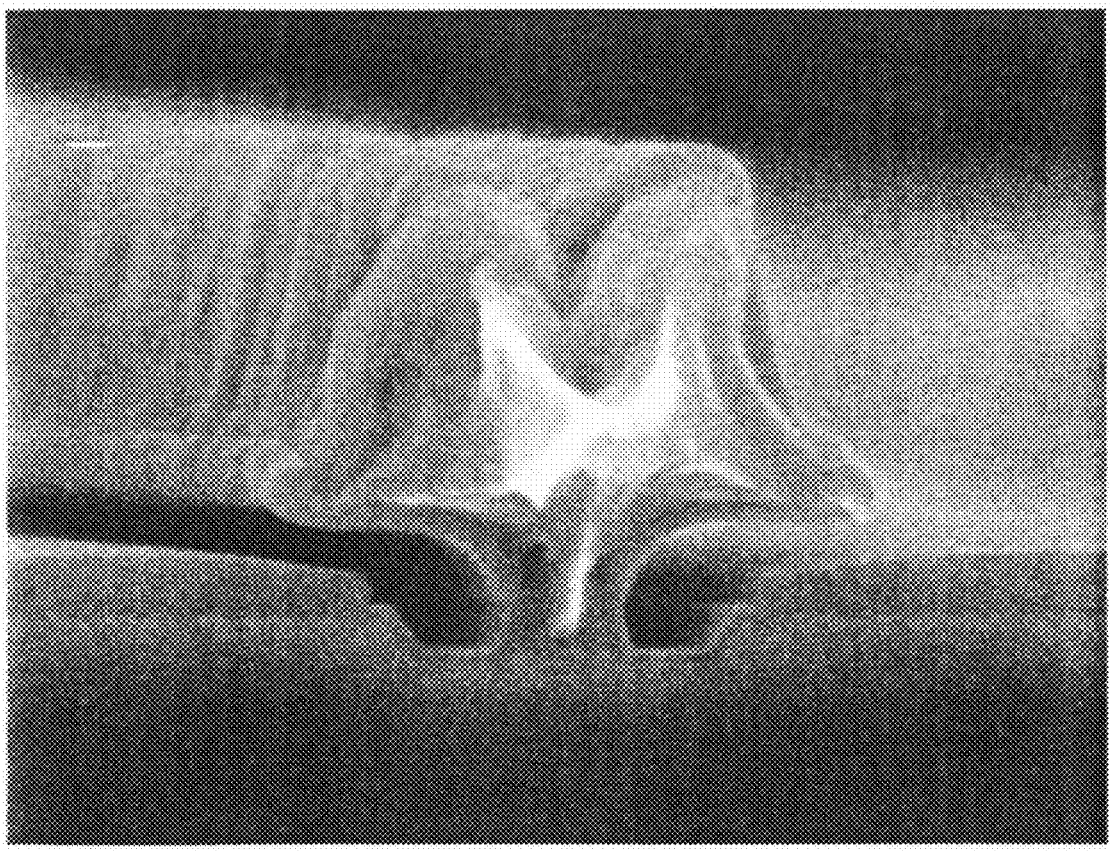
FIG. 11 is a photograph, taken by an electron microscope, showing a cross section of a gate electrode formed in the first exemplary embodiment.

FIG. 11 is a photograph, taken by an electron microscope, showing a cross section of the gate electrode obtained by splitting the substrate of the FET element thus formed. The gate electrode has a substantially T-shaped configuration. Since the center falls (deposited) into the gate opening, two "mountains" are formed.

In this manufacturing method side etching (undercut) is performed from the gate opening 33 of the first photoresist film 32, thereby forming the contact spacing of the contact region by self-alignment. The contact spacing, therefore, is the same on the source and drain sides and symmetrical. On the other hand, if it is desired to adopt an asymmetric arrangement (see FIG. 2) by enlarging the contact spacing on the drain side in order to raise drain breakdown voltage, separate photoresist films may be used in the formation of the recess and in the formation of the gate electrode, and these may be aligned to achieve formation. Further, a photoresist for lift-off formation is provided in such a manner that the cross section of the gate electrode takes on a T-shaped configuration for the sake of a slender gate length. However, if gate length is somewhat large, the cross section of the gate electrode need not be made T-shaped. A gate electrode having a rectangular (FIG. 7) or trapezoidal (FIG. 8) cross section may be formed by an ordinary lift-off method similar to that for ohmic electrodes.

First Exemplary Embodiment; Another Method of Manufacturing T-Shaped Gate Electrode A method of manufacturing a T-shaped gate electrode will be described as another manufacturing method. FIGS. 12A to 12D are process diagrams for describing this method. According to this method, manufacturing is performed using plating and not lift-off. It should be noted that source and drain electrodes are not shown.

Figure 12A:
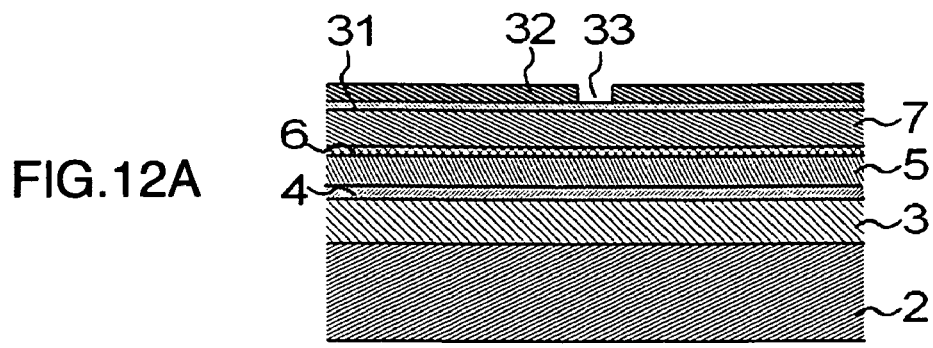
FIGS. 12A to 12D are process diagrams for describing another method of manufacturing a field-effect transistor according to an exemplary embodiment the present invention.

First, the gate opening 33 is formed in the first photoresist film 32 in a manner similar to that of FIG. 10C except for the fact that there is no second photoresist film 34 (FIG. 12A). The thickness of the first photoresist film 32 is 0.1 to 1 μm, the lateral width of the gate opening 33 is about 0.20 μm, and the thickness of the silicon oxide film 31 is 30 to 100 nm.

Figure 12B:
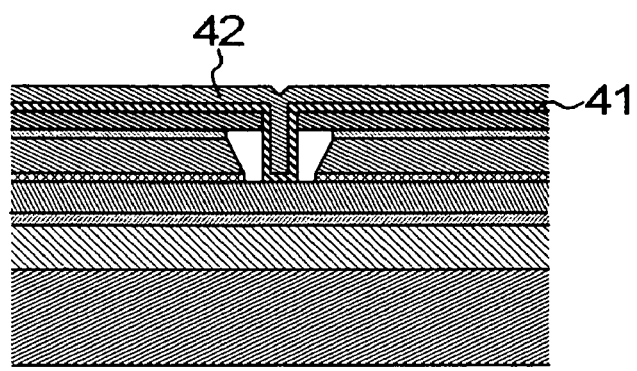

Next, in a manner similar to the process up to FIG. 10E, a recess is formed in the silicon oxide film 31 serving as the surface protection film, the n-type GaAs layer 7 serving as the contact layer and the n-type InGaP layer 6 serving as the etching stop layer. Next, by using a vacuum evaporation apparatus, titanium (Ti) is deposited to a thickness order of 20 to 60 nm as a Schottky metal film 41 and nickel is deposited to a thickness order of 100 to 300 nm as a plating current-feed film 42 (FIG. 12B). An electron gun (E-gun) or sputtering can be used in the vacuum evaporation apparatus just as described earlier. Further, the Schottky metal film 41 is not limited to solely to Ti; various metals can be used, as described in the method of manufacture set forth earlier.

Figure 12C:
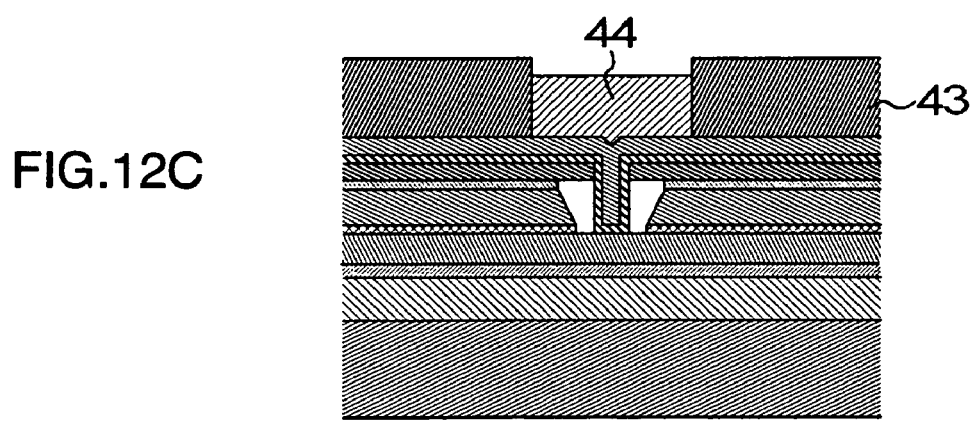

Next, a second photoresist film 43 is formed to a thickness of 1 to 3 μm and a wiring opening having a lateral width of, e.g., 0.5 to 2 μm is formed, after which Ni plating is grown in the opening to a thickness order of 0.5 to 2 μm to thereby form plating wiring 44 (FIG. 12C).

Figure 12D:
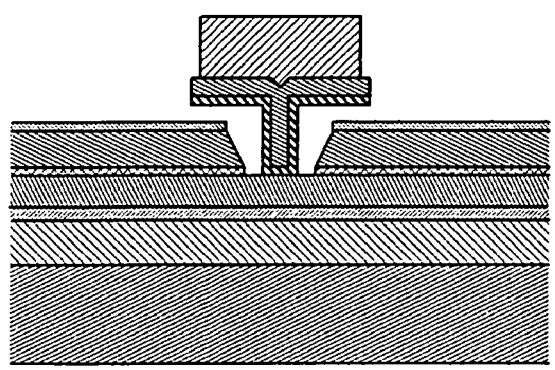

Next, the plating current-feed film 42 and the Schottky metal film 41 remaining on the outer side of the plating wiring 44 are etched away by covering the latter with a photoresist film (FIG. 12D). Although dry etching is possible, acidic or alkaline wet etching also is possible.

On the other hand, platinum (Pt), titanium nitride (TiN) or titanium silicide (TiSi), etc., can be inserted on the Schottky metal film 41 of Ti or the like to a thickness of several tens to several hundred nm as a barrier metal film, and a low-resistance metal such as gold (Au) or copper (Cu) can be deposited thickly as plating. This is not limited to a gate electrode and can be adopted as first layer wiring by extension or for other.

As a further method of manufacturing a T-shaped gate electrode, the Schottky metal film 41 of Ti or the like is deposited for this deposition of metal of the gate electrode. Then, after this deposition, aluminum (Al) rather than Ni may be deposited thickly over the entire surface to a thickness order of 0.5 to 3 μm. In order to protect this Al, Ti, etc., identical with the metal of the Schottky metal film 41 may be deposited thinly to a thickness of several tens of nm, after which dry etching processing may be performed using a photoresist film pattern as a mask, thereby forming the T-shaped gate electrode. Further, in the deposition of Al by sputtering, Si or Cu up to several percents may be contained.

As aforementioned, the gate electrode 12 has been formed by providing the first photoresist film 32 on the silicon oxide film ($SiO_2$ film) 31 serving as the surface protection film. However, after the gate opening is formed in the silicon oxide film 31, the first photoresist film 32 may be removed and the gate electrode 12 may be formed directly on the silicon oxide film 31. A structural element may be obtained also by not removing that film and leaving it on until the end. Further, instead of the silicon oxide film 31, silicon nitride film (SiN film), aluminum nitride film (AlN film) or boron nitride film (BN film), etc., may be used. The film thickness should be made small if it is desired to form a slender gate opening (gate length). If parasitic capacitance of the gate electrode protruding from the side of the T-shape is a problem, then the film thickness should be made large.

On the other hand, if it is not the case with self-alignment in which separate photoresist films are adopted for recess formation and formation of the gate opening, the recess may be formed solely by a photoresist film pattern without using the silicon oxide film ($SiO_2$) 31 in the initial recess formation. Thereafter, a silicon oxide film (SiN film), aluminum oxide film (AlN film), boron nitride film (BN film) or silicon oxide film ($SiO_2$ film), etc., may be deposited as a protective insulating film so as to cover the interior of the recess, thus forming a gate opening, a T-shaped gate electrode may be formed in the gate opening and one of the exemplified protective insulating films may be deposited afresh in order to protect the gate electrode and ohmic electrode. Although the thickness of the protective insulating film in which the gate opening is formed can be set appropriately, a thick insulating film makes it possible to reduce the parasitic capacitance of the gate electrode protruding to the side of the T-shape. In general, the exemplified nitride film including especially the SiN film is dense but has a large dielectric constant. Therefore, a nitride film such as SiN film that protects the semiconductor surface at the beginning is deposited thinly as an insulating film for forming the gate opening, and $SiO_2$ film or an organic film or the like such as polyimide having a small dielectric constant by comparison is deposited thickly, thereby making it possible to reduce the parasitic capacitance of the gate electrode. Further, after the T-shaped gate electrode is formed in the gate opening on the upper side using the photoresist film, this photoresist film may be removed and, in order to protect the gate electrode, etc., a protective insulating film may be deposited afresh on the protecting insulating film provided at the beginning in order to protect the semiconductor surface. Alternatively, after the T-shaped gate electrode may be formed in a gate opening only of the photoresist film without providing a protective insulating film at the beginning, the photoresist film may be removed followed by depositing the protective insulating film. Further, the cross section of the gate electrode in each of these cases may be rectangular or trapezoidal.

Second Exemplary Embodiment; FET Cross-Sectional Structure

Next, a FET according to a second exemplary embodiment of the present invention will be described. First, for a low-noise FET, it is necessary to lower the minimum noise figure NFmin and raise the associated gain Ga. In the structure of the first exemplary embodiment shown in FIG. 1, if the carrier concentration of the n-type AlGaAs of the electron supply layer is raised from $2.5\times10^{18}$ cm$^{-3}$ to $3.0\times10^{18}$ cm$^{-3}$ and the layer is made thin, the gate reverse-breakdown voltage declines, saturation of the drain current deteriorates and associated gain Ga declines. In the first exemplary embodiment, therefore, the carrier concentration is halted (from further elevation) at $2.5\times10^{18}$ cm$^{-3}$.

Figure 13:
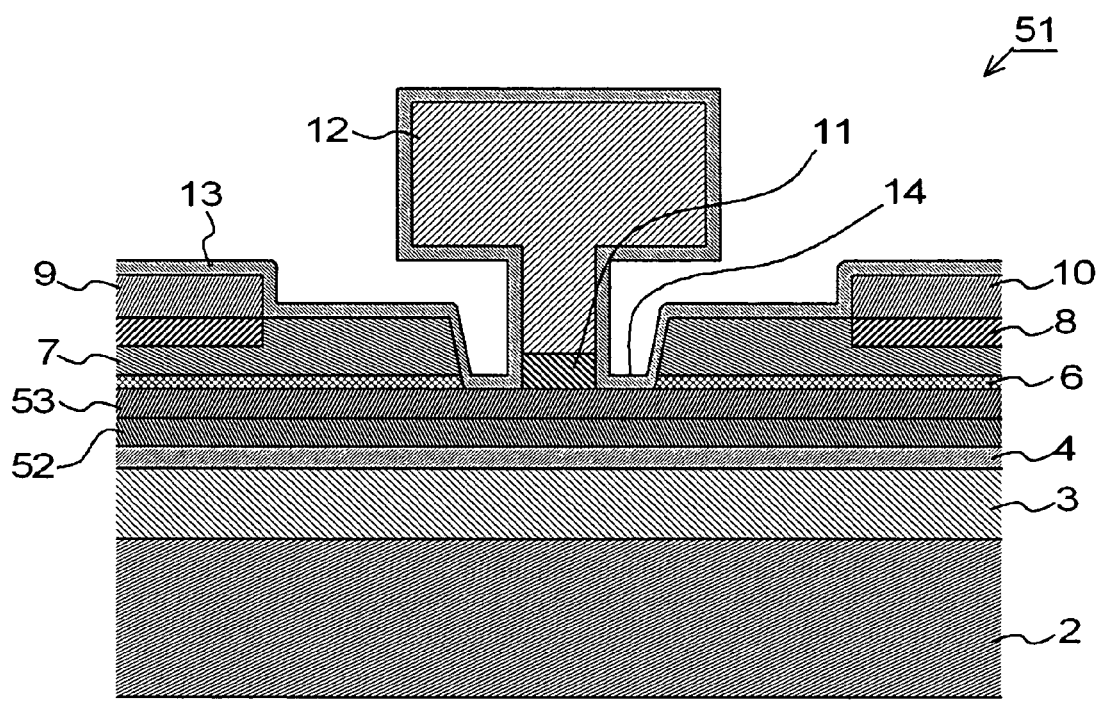
FIG. 13 is a sectional view of a field-effect transistor according to a second exemplary embodiment of the present invention.

FIG. 13 is a sectional view of a FET according to a second exemplary embodiment of the present invention. In the second exemplary embodiment, in order to prevent a decline in gate reverse-breakdown voltage and worsening of the saturation of drain current, the n-type AlGaAs layer serving as the electron supply layer is formed a dual layer structure in which the carrier concentration on the upper side (the side of the gate electrode) is lowered and the carrier concentration on the lower side (the side of the GaAs substrate) is raised.

One example of a FET 51 according to the second exemplary embodiment will be described. The carrier concentration of a low-concentration n-type AlGaAs layer 53 on the upper side contacted by the gate electrode 12 can be made $2.0\times10^{18}$ cm$^{-3}$, and the carrier concentration of a high-concentration n-type AlGaAs layer 52 on the lower side can be made $4.0\times10^{18}$ cm$^{-3}$. This stacked structure in other aspects is similar to that of the first exemplary embodiment shown in FIG. 1.

Described next will be an example of arrangement of epitaxial semiconductor layers in the vertical direction according to the second exemplary embodiment shown in FIG. 13. Semiconductor layers set forth below can be deposited on the surface of the semi-insulating GaAs substrate 2 using the MBE method. The i-type GaAs layer 3 serving as the buffer layer is not doped with an impurity and has a thickness of about 500 nm. The i-type InGaAs layer 4 serving as the two-dimensional electronic gas layer has a thickness of 13 nm. The high-concentration n-type AlGaAs layer 52 serving as the lower side of the electron supply layer has a thickness of 10 nm, is doped with an n-type carrier impurity Si and has a carrier concentration of $4.0\times10^{18}$ cm$^{-3}$. The low-concentration n-type AlGaAs layer 53 serving as the upper side of the electron supply layer has a thickness of 19 nm, is doped with an n-type carrier impurity Si and has a carrier concentration of $2.0\times10^{18}$ cm$^{-3}$. The n-type InGaP layer 6 serving as the etching stop layer has a thickness of 10 nm, is doped with an n-type carrier impurity Si and has a carrier concentration of $4.0\times10^{18}$ cm$^{-3}$. The n-type GaAs layer 7 serving as the contact layer has a thickness of 100 nm, is doped with an n-type carrier impurity Si and has a carrier concentration of $4.0\times10^{18}$ cm$^{-3}$.

It should be noted that although the doping concentration of a carrier impurity is indicated by electrically activated carrier concentration, the activation rate, which is a relationship between the two, exhibits correlation and a difference in concentration of Si impurity, which changes from one semiconductor layer to another, can be confirmed by analysis. For example, a change in relative concentration can be investigated by analyzing the epitaxial semiconductor layer using secondary ion mass spectrometry (SIMS) or Auger electron spectroscopy (AES) while the recess is formed from the side of the surface.

In the second exemplary embodiment, gate length is set about 0.20 μm, the distance between the gate electrode 12 and the n-type GaAs layer 7 serving as the contact layer is set about 0.15 μm, total gate width is made 200 μm and four gate electrodes of 50 μm are used. This is the same as in the first exemplary embodiment. Further, an adjustment can be made in such a manner that the gate threshold voltage Vt becomes about −0.9 V by changing the concentrations and thicknesses of the two electron supply layers in an experiment.

Second Exemplary Embodiment; FET Characteristics and Effects

The characteristics of the FET according to the second exemplary embodiment are compared with the case of the single layer in which the carrier concentration of the n-type AlGaAs electron supply layer according to the first exemplary embodiment is $2.5\times10^{18}$ cm$^{-3}$. The FET chip was assembled into a molded resin package and measured. It should be noted that the FET element uses an MBE-grown wafer and has a gate length of about 0.20 μm, a total gate width of 200 μm and a gate threshold voltage Vt of about −0.9 V. This is the same as in the first exemplary embodiment.

Drain current Idss at a drain voltage Vds of 2.0 V and gate voltage Vgs of 0.0 V increased from 58 mA to 68 mA. The mutual conductance gm at a drain current Ids of 10 mA increased from 65 mS to 75 mS, and hence the effect of raising the concentration of the lower side of the electron supply layer manifested itself. The drain conductance gd as the saturation property of drain current remains at an increase of from 4.5 mS to 4.8 mS.

The high-frequency characteristic was measured under drain bias conditions of Vds=2.0 V, Ids=10 mA. The cutoff frequency ft increased from 71 GHz to 73 GHz, and the maximum oscillation frequency fmax increased from 101 GHz to 105 GHz. The minimum noise figure NFmin and associated gain Ga at 12 GHz changed from 0.37 dB and 12.7 dB to 0.33 dB and 12.9 dB, respectively, and hence an improvement was achieved in that the minimum noise figure NFmin was reduced and the associated gain Ga raised.

What is noteworthy is that with the gate voltage Vgs of the second exemplary embodiment at about −0.3 V, the maximum gm value is 116 mS (=580 mS/mm). In the first exemplary embodiment, the maximum gm value was 92 mS (=460 mS/mm) at a gate voltage Vgs of about −0.4 V. It was found that the gate voltage Vgs for which gm is largest extends to the positive side and that the gm value also rises. In the second exemplary embodiment, it was found that the conditions are optimum at this gate voltage, i.e., that the minimum noise figure NFmin is smallest and that the associated gain Ga rises.

Thus, the gate width was decreased by 20%, namely by a factor of 0.8, from 200 μm to 160 μm so as to make the drain-current condition to 10 mA. That is, with four gate electrodes, the gate width of one gate electrode was changed from 50 μm to 40 μm. Measurement was performed under drain bias conditions of Vds=2.0 V and Ids=10 mA. The mutual conductance gm and the drain conductance gd were 85 mS and 4.0 mS, respectively. The cutoff frequency ft and maximum oscillation frequency fmax were 75 GHz and 112 GHz, respectively. The minimum noise figure NFmin obtained at 12 GHz was low at 0.31 dB, and the associated gain Ga obtained at this time was a high value of 13.7 dB. Thus, performance as a low-noise amplification element was greatly improved.

Further, dependence between gate length and contact spacing in one example of the second exemplary embodiment is substantially the same as in the first exemplary embodiment. The desirable dimensions are approximately the same, namely a gate length of 0.15 to 0.25 μm and a contact spacing of 0.10 to 0.5 μm. However, the abruptness of the short-channel effect in a case where the gate length is made shorter than 0.15 μm is diminished in comparison with the first exemplary embodiment.

Even with respect to general amplification (intermediate-stage amplification) performance, which is not limited to a low-noise characteristic, suitably setting the concentrations and thicknesses of two electron supply layers is effective in raising drain breakdown voltage and gate reverse-breakdown voltage and in assuring an appropriate high-frequency performance. It is possible also to further increase the number of stages (layers) of the carrier concentration(s) of the electron supply layer. In addition, by making gate length a large 0.3 to 1 μm, the drain conductance gd as the saturation property of the drain current is kept small and drain breakdown voltage can be raised. Further, by making contact spacing on the source and drain sides asymmetrical and increasing the contact spacing on the drain side, drain breakdown voltage can be raised. In order to raise gate reverse-breakdown voltage, an undoped (i-type) or p-type AlGaAs layer may be thinly inserted with a thickness of 3 to 30 nm as a Schottky layer between the gate electrode 12 (Schottky metal layer 11) and low-concentration n-type AlGaAs layer 53.

Third Exemplary Embodiment; FET Cross-Sectional Structure

Next, a FET according to a third exemplary embodiment of the present invention will be described. FET characteristics according to the exemplary embodiments thus far have been described with regard to an element that employs an MBE-grown wafer in which a steep hetero-interface is obtained. On the other hand, the MOVPE growth method makes it possible to grow a large number of large-diameter wafers simultaneously and makes it possible to raise productivity and lower cost. With a growth apparatus of large volume, however, the steepness of the hetero-interface deteriorates and a particular problem was that the electron mobility of two-dimensional electron gas varies slightly.

A measure for dealing with this problem is disclosed in Patent Document 7. It is stated that electron mobility is raised by thinly inserting an i-type GaAs layer to a thickness of 2 nm as a spacer layer at the interface between an n-type AlGaAs layer serving as an electron supply layer and an i-type InGaAs layer serving as a two-dimensional electron gas layer. However, this embodiment was described in terms of MBE growth. Owing to recent advances in growth technology in MBE growth, the hetero-interface is steepened and a high electron mobility is obtained without the insertion of such a spacer layer. On the other hand, as the result of our studies for raising electron mobility with the MOVPE growth method, it has been confirmed that the insertion of a spacer layer constituted by an i-type GaAs layer is effective.

Figure 14:
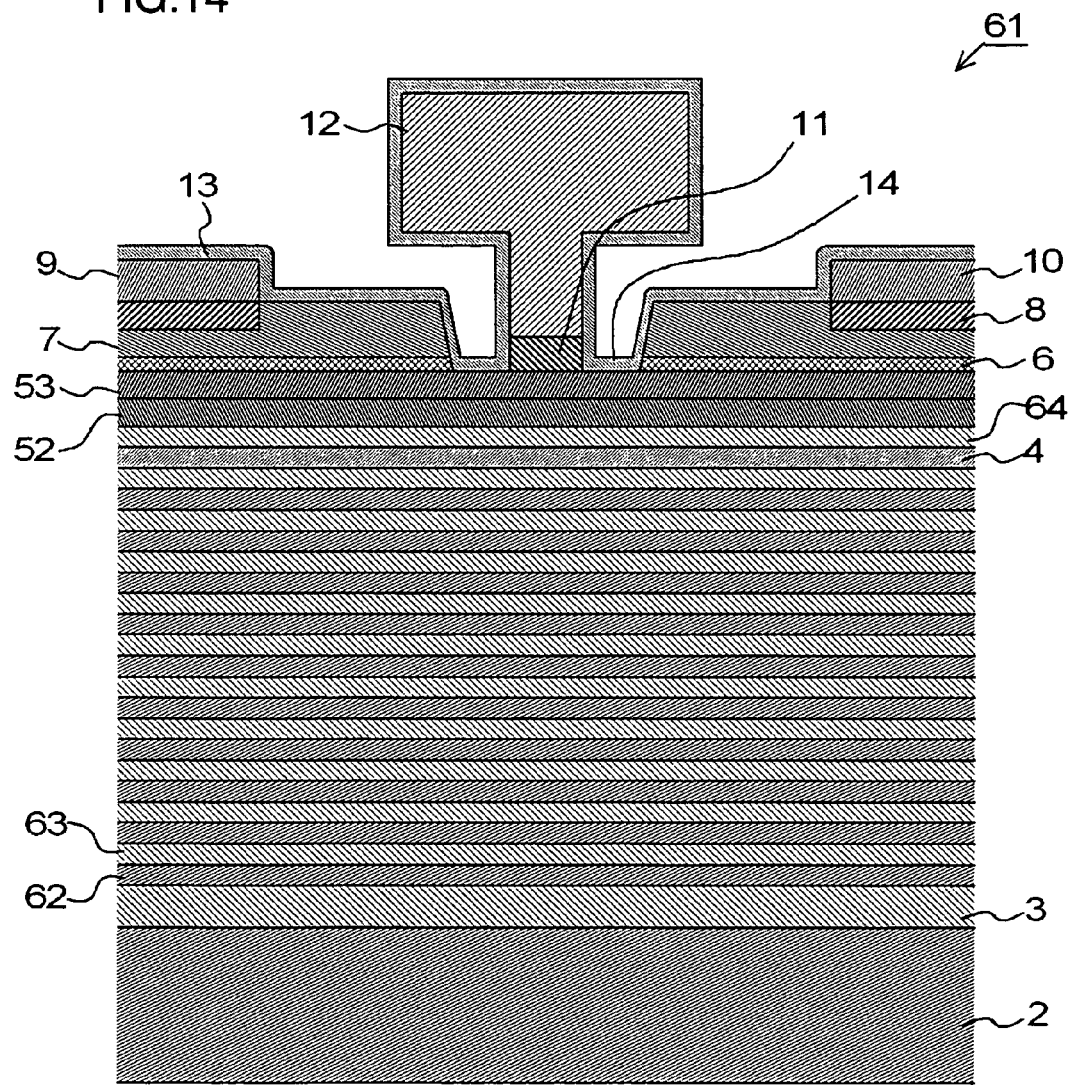
FIG. 14 is a sectional view of a field-effect transistor according to a third exemplary embodiment of the present invention.

FIG. 14 is a sectional view of a FET according to a third exemplary embodiment of the present invention. The surface part at the upper portion of a FET 61 according to the third exemplary embodiment is similar in structure to the second exemplary embodiment. The high-concentration n-type AlGaAs layer 52 and low-concentration n-type AlGaAs layer 53 are stacked. An i-type GaAs layer 64 serving as a spacer layer is inserted beneath these, and the i-type InGaAs layer 4 serving as the two-dimensional electron gas layer is provided beneath the i-type GaAs layer 64. In addition, the FET 61 according to the third exemplary embodiment has laminate layers of an i-type AlGaAs layer 62 and i-type GaAs layer 63 built up alternatingly as buffer layers for stopping propagation dislocation to the surface of the semi-insulating GaAs substrate 2.

An example of a FET structure according to the third exemplary embodiment will be described. The semiconductor layers are grown epitaxially using the MOVPE method as set forth below. By way of example, the i-type GaAs layer 3 undoped with impurities is grown to a thickness of 100 nm on the semi-insulating GaAs substrate 2, after which the alternating growth of the undoped i-type AlGaAs layer 62 to a thickness of 20 nm and undoped i-type GaAs layer 63 to a thickness of 20 nm is repeated, e.g., ten times, an Al composition in Group III elements of 0.15 to 0.30 being adopted for the i-type AlGaAs layer 62. The final i-type GaAs layer 63 is given a thickness of 50 nm. The overall thickness of the buffer layers is, e.g., 530 nm. The arrangement of these built up layers is one example. In accordance with the dislocation density of the semiconductor substrate, the thicknesses of the layers and the number of repetitions can be set so as to stop propagation dislocation.

Next, the i-type InGaAs layer 4 serving as the two-dimensional electron gas layer is formed to a thickness of 13 nm as a buffer layer on the final i-type GaAs layer 63. Next, the i-type GaAs layer 64 serving as a spacer layer is formed to a thickness of 2 nm. Next, the high-concentration n-type AlGaAs layer 52 serving as the electron supply layer is formed to a thickness of 10 nm and is doped with n-type carrier impurity Si to obtain a carrier concentration of $4.0 \times 10^{18}$ cm$^{-3}$. The low-concentration n-type AlGaAs layer 53 is formed on the layer 52 to a thickness of 19 nm and is doped with n-type carrier impurity Si to obtain a carrier concentration of $2.0 \times 10^{18}$ cm$^{-3}$. The n-type InGaP layer 6 serving at the etching stop layer is formed to a thickness of 10 nm and is doped with n-type carrier impurity Si to obtain a carrier concentration of $4.0 \times 10^{18}$ cm$^{-3}$. The n-type GaAs layer 7 serving as the contact layer is formed to a thickness of 100 nm and is doped with n-type carrier impurity Si to obtain a carrier concentration of $4.0 \times 10^{18}$ cm$^{-3}$.

Third Exemplary Embodiment; FET Characteristics and Effects

First, the electron mobility of the two-dimensional electron gas in the wafer grown by MOVPE was measured. The n-type GaAs layer 7 serving as a contact layer influenced by electrical conductivity is removed by wet etching utilizing the n-type InGaP layer 6 serving as the etching stop layer. A sample provided with electrodes at the four corners was fabricated from this wafer substrate and electron mobility measured at room temperature (about 20 degrees C.) using the Hall effect method was about 6500 cm$^2$/Vs. Conventionally, with MOVPE growth in a case where the i-type GaAs layer 64 serving as the spacer layer is not inserted, electron mobility was low and suffered variation, i.e., ranging 4000 to 6000 cm$^2$/Vs. By comparison, with the second exemplary embodiment, in a case where the i-type GaAs layer serving as the spacer layer is not included owing to MBE growth and the n-type GaAs contact layer is similarly removed, the electron mobility was about 7000 cm$^2$/Vs. From this it has been confirmed that electron mobility near that of MBE growth is obtained by inserting the i-type GaAs layer 64, which serves as the spacer layer, by MOVPE growth.

Next, the FET according to the third exemplary embodiment was assembled into a molded resin package and the FET characteristic was measured. The FET element had a gate length of about 0.20 µm, a contact spacing of about 0.15 µm and a total gate width of four gate electrodes of 160 µm (the gate width of one gate was 40 µm). As a comparison example, an element having a total gate width of 160 µm with MBE-grown semiconductor layers according to the second exemplary embodiment was used as a reference. The gate threshold voltages Vt of both were the same, about −0.9 V. Drain current Idss at a drain voltage Vds of 2.0 V and gate voltage Vgs of 0.0 V changed from 54 mA (second exemplary embodiment) to 52 mA (third exemplary embodiment), which are substantially of the same level. The mutual conductance gm at a drain current Ids of 10 mA changed from 80 ms to 77 ms, and drain conductance gd changed from 4.0 mS to 3.8 mS, meaning that relatively close values were obtained, respectively.

With regard to the frequency characteristic also, cutoff frequency ft changed from 75 GHz to 72 GHz, and maximum oscillation frequency fmax changed from 112 GHz to 105 GHz, meaning that relatively close values were obtained. The minimum noise figure NFmin at 12 GHz and associated gain Ga at this time changed from 0.31 dB and 13.7 dB to 0.34 dB and 13.2 dB, respectively, meaning that relatively close values were obtained.

As a result of the third exemplary embodiment using the MOVPE-grown semiconductor layers, the electron mobility is slightly low in comparison with the second exemplary embodiment based upon MBE growth, and therefore the mutual conductance gm is a little low, the minimum noise figure NFmin is a little large and the associated gain Ga is a little low. However, although high-frequency performance as a low-noise element is lowered slightly in comparison with the second exemplary embodiment using the MBE-grown substrate, mass-productivity is excellent. Accordingly, this exemplary embodiment lends itself to low-cost general-purpose products.

Further, that general amplification (use for intermediate-stage amplification) performance, which is not limited to a low-noise characteristic, can be supported is as in the second exemplary embodiment. Further, drain breakdown voltage may be raised by making contact spacing asymmetrical, i.e., larger on the drain side than on the source side. Furthermore, in order to raise gate reverse-breakdown voltage, an undoped (i-type) or a p-type AlGaAs layer may be thinly inserted to a thickness of order 3 to 30 nm as a Schottky layer between the gate electrode 12 (Schottky metal layer 11) and low-concentration n-type AlGaAs layer 53.

Further, although an i-type GaAs layer serving as a spacer layer was given a thickness of 2 nm, this thickness can be enlarged to an order of 10 nm so as to assure uniformity and reproducibility with an apparatus having a large-volume growth chamber for handling a large number of large-diameter wafers. Further, although the n-type InGaP layer serving as the etching stop layer was given a thickness of 10 nm, this thickness can be enlarged to an order of 20 nm so as to assure uniformity and reproducibility,

Fourth Exemplary Embodiment; FET Cross-Sectional Structure

Next, a FET according to a fourth exemplary embodiment of the present invention will be described. If an extremely high frequency of 20 GHz is exceeded as milliwaves, it is difficult for radio waves to travel far owing to absorption as by moisture in the air. In the extremely high frequency band, however, an advantage is that antenna length can be shortened and the transmitter reduced in size. With a data network for short-distance communication, therefore, a low-noise FET in the extremely high frequency band is sought. If the gate length thus far is simply shortened from 0.2 µm to 0.1 µm, a short-channel effect is produced and saturation of the drain current deteriorates, which necessitated, therefore, that measures be taken.

Figure 15:
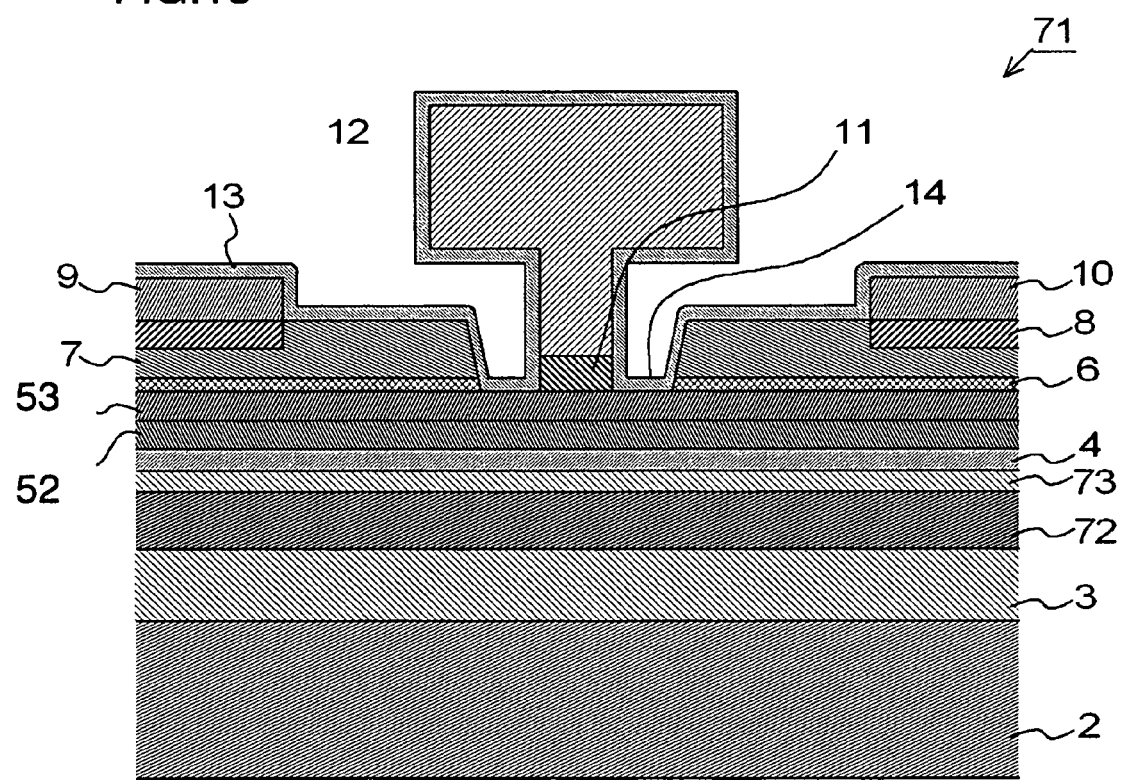
FIG. 15 is a sectional view of a field-effect transistor according to a fourth exemplary embodiment of the present invention.

FIG. 15 is a schematic sectional view of a FET according to a fourth exemplary embodiment. In order to suppress the short-channel effect in the fourth exemplary embodiment, an opposite-polarity p-type layer is formed within the buffer layer. That is, in a field-effect transistor 71, a p-type AlGaAs layer 72 serving as an opposite-polarity layer is inserted between the i-type GaAs layer 3 and an i-type GaAs layer 73 serving as buffer layers.

An example of the FET structure according to the fourth exemplary embodiment will be described. Semiconductor layers can be built up by MBE growth on the surface of the semi-insulating GaAs substrate 2 as follows, by way of example: The i-type GaAs layer 3 serving as the buffer layer is undoped and formed to a thickness of about 300 nm. The p-type AlGaAs layer 72 serving as the opposite-polarity layer is formed to a thickness of 200 nm, the Al composition in Group III elements (atomic ratio) being 0.15 to 0.30, and the layer is doped with p-type carrier impurity C (carbon) to obtain a carrier concentration of $5\times10^{16}$ cm$^{-3}$. The i-type GaAs layer 73 serving as a portion of the buffer layer is undoped and formed thereon to a thickness of 20 nm. The i-type InGaAs layer 4 serving as the two-dimensional electron gas layer is formed to a thickness of 13 nm. The high-concentration n-type AlGaAs layer 52 serving as the electron supply layer is formed to a thickness of 8 nm and is doped with n-carrier impurity Si to obtain a carrier concentration of $4.0\times10^{18}$ cm$^{-3}$. The low-concentration n-type AlGaAs layer 53 is formed thereon to a thickness of 17 nm and is doped with n-carrier impurity Si to obtain a carrier concentration of $2.0\times10^{18}$ cm$^{-3}$. The n-type InGaP layer 6 serving as the etching stop layer is formed to a thickness of 10 nm and is doped with n-carrier impurity Si to obtain a carrier concentration of $4.0\times10^{18}$ cm$^{-3}$. The n-type GaAs layer 7 serving as the contact layer is formed to a thickness of 100 nm and is doped with n-carrier impurity Si to obtain a carrier concentration of $4.0\times10^{18}$ cm$^{-3}$.

Carbon (C) was used as the p-type carrier impurity (acceptor impurity). The element used as the p-type acceptor impurity is not limited to carbon (C); beryllium (Be) or magnesium (Mg), etc., may be used.

The gate length of the gate electrode 12 provided on the low-concentration n-type AlGaAs layer 53 can be shortened to, e.g., 0.12 μm, and the lateral width at the upper portion of the T-shape can be made to an order of 0.5 to 2 μm. The contact spacing between the gate electrode 12 and the n-type GaAs layer 7 serving as the contact layer is enlarged to, e.g. 0.25 μm in order to assure drain breakdown voltage and the saturation property of the drain current. Further, since the mutual conductance gm increases, it is desired that the gate threshold voltage Vt be set to a shallow (small) −0.8 V so as to obtain the minimum noise figure NFmin at 2.0 V, 10 mA.

Fourth Exemplary Embodiment; FET Characteristics and Effects

The semiconductor chip according to the fourth exemplary embodiment was assembled into a molded resin package and the electrical characteristics were measured. The FET element according to the fourth exemplary embodiment had a gate length of about 0.12 μm, a contact spacing of about 0.25 μm and a total gate width of 160 μm and was arranged as in the second exemplary embodiment. This was compared with one having the gate length of about 0.20 μm and contact spacing of about 0.15 μm according to the second exemplary embodiment. The gate threshold voltages Vt of both were the same, about −0.9 V. Mutual conductance gm at a drain bias of 2.0 V, 10 mA increased from 73 mS (second exemplary embodiment) to 85 mS (fourth exemplary embodiment). On the other hand, drain conductance gd increased slightly from 3.9 mS to 4.2 mS, showing that the increase was greatly suppressed by the effect of embedding the p-type layer beneath the gate and the effect of enlarging the contact width.

The cutoff frequency ft in the bias conditions rose from 75 GHz to about 120 GHz, and maximum oscillation frequency fmax rose from 112 GHz to about 180 GHz. The minimum noise figure NFmin and associated gain Ga at 12 GHz were 0.31 dB and 13.7 dB, respectively, in the second exemplary embodiment and were 0.27 dB and 14.5 dB, respectively, in the fourth exemplary embodiment. At 30 GHz, the values were about 0.8 dB and about 10 dB, respectively, in the second exemplary embodiment and were about 0.7 dB and about 12 dB, respectively, in the fourth exemplary embodiment. At 60 GHz, the values were about 1.7 dB and about 6 dB, respectively, in the second exemplary embodiment and were about 1.4 dB and about 9 dB, respectively, in the fourth exemplary embodiment. By thus shortening the gate length to 0.12 μm and embedding the opposite-polarity p-type layer under the gate, high-frequency performance at 30 GHz and 60 GHz in the extremely high frequency band was improved and the effects of the fourth exemplary embodiment manifested themselves.

Since AlGaAs as the opposite-polarity p-type layer affords a larger band gap than does GaAs, the channel carrier confining effect is high. However, it is possible to adopt the GaAs layer as the opposite-polarity p-type layer and the barrier property can be improved by raising the p-type carrier concentration. Further, the carrier concentration of the p-type layer and the thickness thereof can be suitably set in accordance with gate length, etc. Further, an electrode may be provided by causing zinc (Zn), AuZn or the like to diffuse into the embedded p-type layer as p-type contact at the edge, etc., of the element region, and a potential may be applied to the electrode.

Further, that general amplification (use for intermediate-stage amplification) performance, which is not limited to a low-noise characteristic, can be supported (compatible) is similar to the foregoing exemplary embodiments. By inserting an opposite-polarity p-type layer with a gate length of an order of 0.3 to 1 μm, drain conductance gd as the saturation property of drain current can be kept small and drain breakdown voltage is raised. Further, drain breakdown voltage may be raised by making contact spacing asymmetrical, i.e., larger on the drain side than on the source side. Furthermore, an undoped (i-type) or a p-type AlGaAs layer may be thinly inserted to a thickness of 3 to 30 nm as a Schottky layer, for raising gate reverse-breakdown voltage, between the gate electrode 12 (Schottky metal layer 11) and low-concentration n-type AlGaAs layer 53.

Fifth Exemplary Embodiment; FET Cross-Sectional Structure

Figure 16:
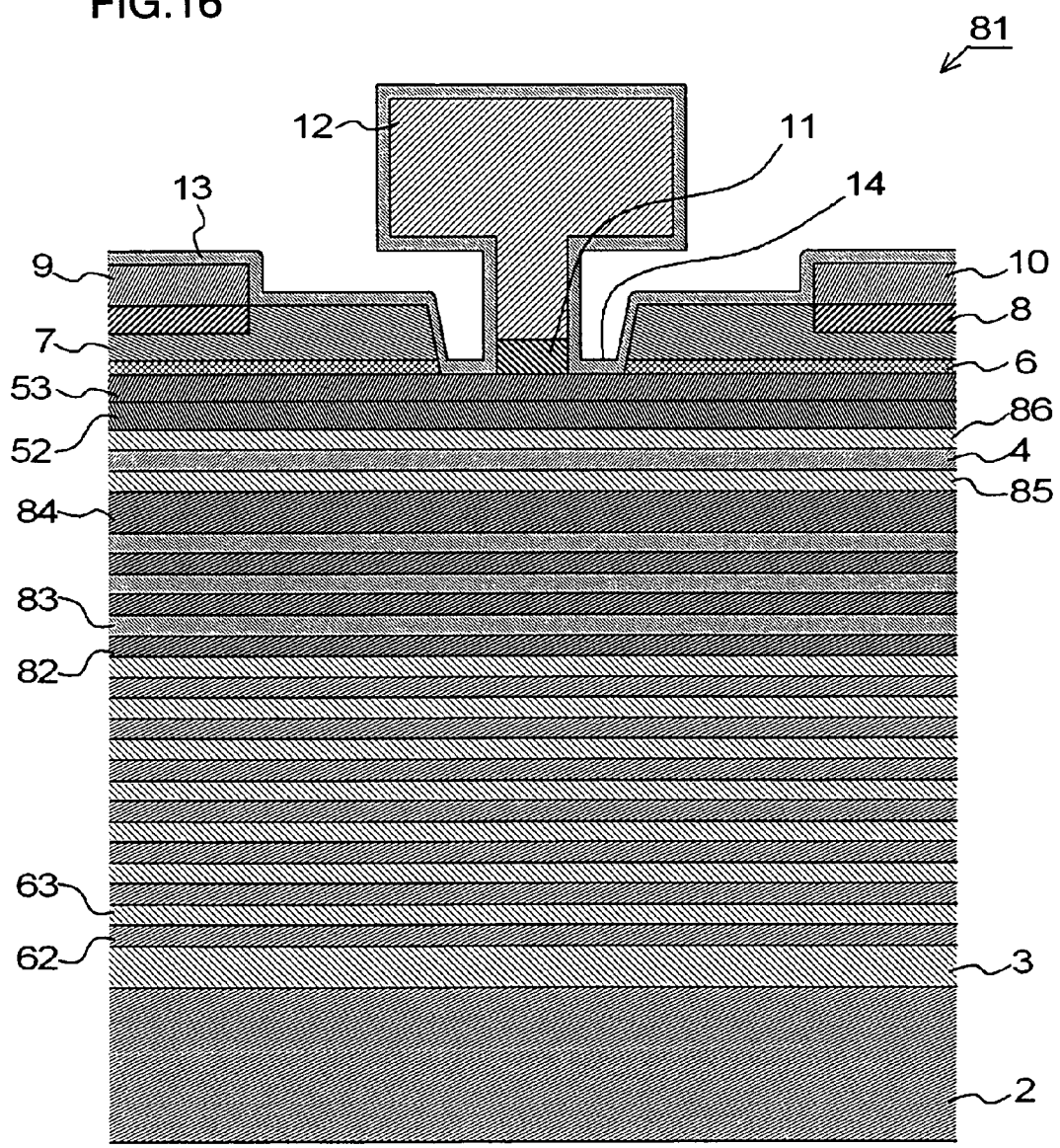
FIG. 16 is a sectional view of a field-effect transistor according to a fifth exemplary embodiment of the present invention.

Next, a FET according to a fifth exemplary embodiment of the present invention will be described. FIG. 16 is a sectional view of a field-effect transistor according to a fifth exemplary embodiment. The fifth exemplary embodiment is a modification of the third exemplary embodiment that employs MOVPE growth and has the alternating buffer layers, and it additionally includes embedded p-type layers formed as buffer layers as in the fourth exemplary embodiment.

An example of a FET structure according to the fifth exemplary embodiment will be described. In a field-effect transistor 81, the i-type GaAs layer 3 undoped with impurities is grown to a thickness of 100 nm as a buffer layer for stopping propagation dislocation to the surface of the semi-insulating GaAs substrate 2, after which an undoped i-type AlGaAs layer 62 (thickness: 20 nm) and an i-type GaAs layer 63 (thickness: 20 nm) are built up alternatingly seven times, an In composition in Group III elements of 0.15 to 0.30 being adopted for the i-type AlGaAs layer 62. Next, as a group of opposite-polarity layers, a p-type AlGaAs layer 82 (thickness: 20 nm) and a p-type GaAs layer 83 (thickness: 20 nm) doped with carbon (C) at a carrier concentration of $5\times10^{16}$ cm$^{-3}$ are built up alternatingly three times, and a p-type AlGaAs layer 84 (thickness: 100 nm) is further formed to thereby fabricate an opposite-polarity layer (structure). An i-type GaAs layer 85 serving as a portion of the buffer layer is undoped and formed thereon to a thickness of 20 nm. Next, the i-type InGaAs layer 4 serving as the two-dimensional electron gas layer is formed to a thickness of 13 nm. Next, an i-type GaAs layer 86 serving as a spacer layer is formed to a thickness of 2 nm. The high-concentration n-type AlGaAs layer 52 serving as the electron supply layer is formed to a thickness of 8 nm and is doped with n-carrier impurity Si to obtain a carrier concentration of $4.0 \times 10^{18}$ $cm^{-3}$. The low-concentration n-type AlGaAs layer 53 is formed thereon to a thickness of 17 nm and is doped with n-carrier impurity Si to obtain a carrier concentration of $2.0 \times 10^{18}$ $cm^{-3}$. Next, the n-type InGaP layer 6 serving as the etching stop layer is formed to a thickness of 10 nm and is doped with n-carrier impurity Si to obtain a carrier concentration of $4.0 \times 10^{18}$ $cm^{-3}$. The n-type GaAs layer 7 serving as the contact layer is formed to a thickness of 100 nm and is doped with n-carrier impurity Si to obtain a carrier concentration of $4.0 \times 10^{18}$ $cm^{-3}$.

In order to hold down the thickness of the buffer layers in this exemplary embodiment, p-type impurity is added from midway along the built up buffer layers that are for stopping propagation dislocation to thereby obtain an opposite-polarity layer. However, a p-type AlGaAs layer serving as the opposite-polarity layer may be grown thickly after the built up buffer layers for stopping propagation dislocation are grown.

Sixth Exemplary Embodiment; Packaging of Semiconductor Chip

Figure 17:
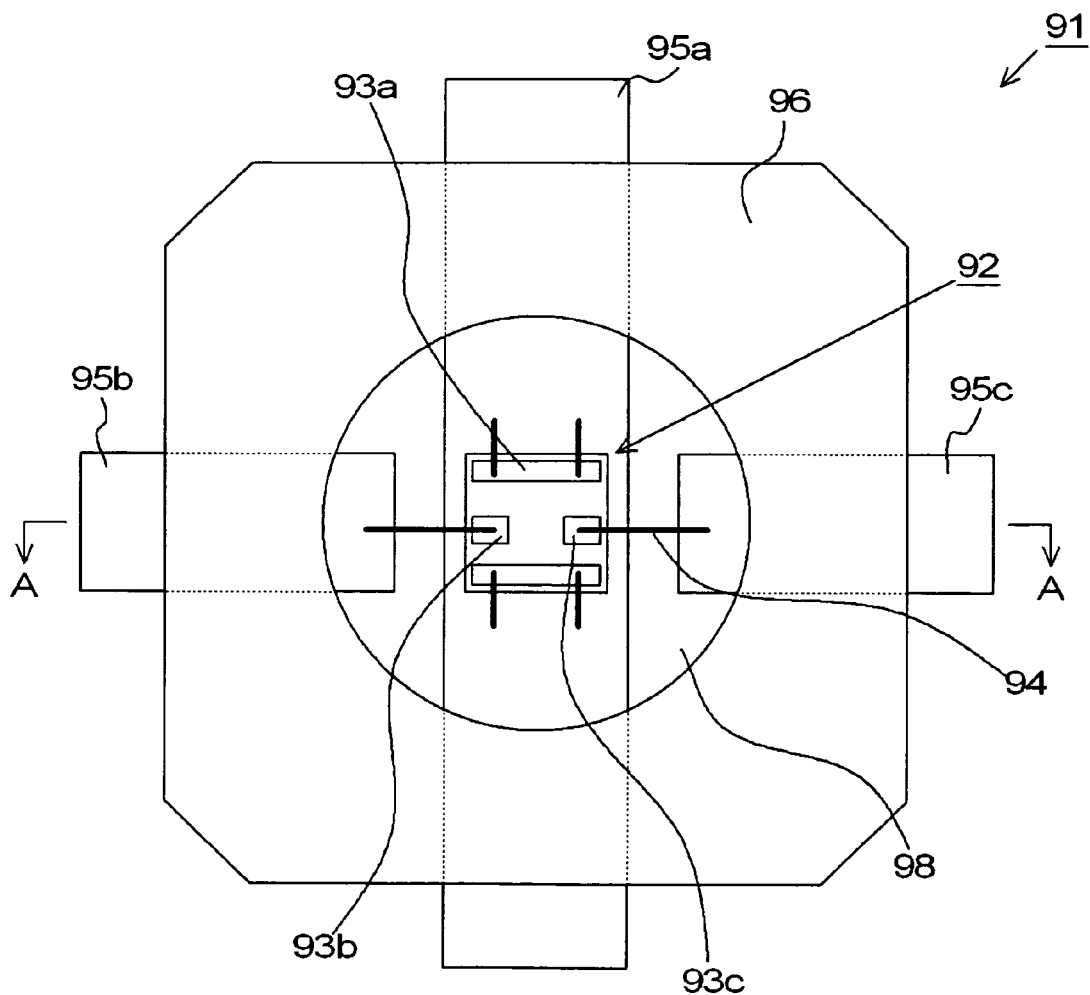
FIG. 17 is a top plan view of a semiconductor device according to a sixth exemplary embodiment of the present invention.
Figure 18:
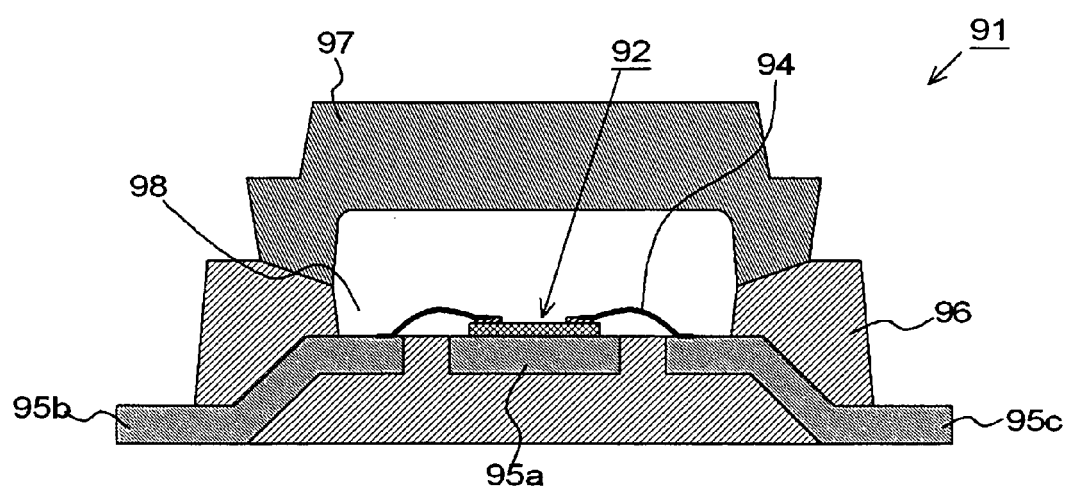
FIG. 18 is a sectional view taken along line A-A of FIG. 17.

Next, a semiconductor device in which the FET (semiconductor chip) of the present invention has been packaged will be described as a sixth exemplary embodiment of the present invention. The package (vessel) in which the semiconductor chip is assembled and mounted is made of a ceramic or molded resin. In general, a package made of molded resin is employed widely owing to its low cost. Both types are substantially the same in terms of manufacture and form and only the materials of the vessel differ. In this exemplary embodiment, therefore, a package made of molded resin will be described as an example. FIG. 17 is a top plan view of a semiconductor device 91 in which a semiconductor chip is assembled into a package and is not capped with resin. FIG. 18 is a sectional view taken along line A-A of FIG. 17. In FIG. 18, however, a resin cap has been attached. It should be noted that the dimensions set forth in the description below serve as only one example and that the invention is not limited to these dimensions.

In the top plan view of the semiconductor device 91 shown in FIG. 17, a resin vessel 96 made of molded resin and serving as a package is an approximately 2.6 mm square the center of which has a cavity (recess) 98 that accommodates a semiconductor chip 92. A source lead 95*a* serving as a ground terminal is a band-shaped, thin metal plate having a width of about 0.6 mm. It passes through the interior of the resin vessel 96 and the terminal leads thereof project by about 0.3 mm from both sides of the vessel. The source lead 95*a* is exposed at the bottom of the cavity 98 of resin vessel 96, and the semiconductor chip 92 is secured on the source lead 95 as by a high-temperature solder or metal paste of AuSn or the like. Located in the cavity 98 of the resin vessel 96 are a gate lead 95*b* serving as an input terminal and a drain lead 95*c* serving as an output terminal and arranged so as to oppose the gate lead 95*b*. Each of these leads 95*b*, 95*c* has a width of about 0.5 mm and one end of each lead is exposed at the bottom of the cavity 98 of resin vessel 96 and projects outward by 0.3 mm. In this case, the distance between the outer tips of the leads along each of the perpendicularly intersecting directions have a distance of about 3.2 mm.

The top face of the semiconductor chip 92 has a form similar to that shown in FIG. 3 and is approximately 0.3 mm square, by way of example. A gate pad 93*b* serving as an input terminal and a drain pad 93*c* serving as an output terminal are approximately 60 μm square and are formed so as to oppose each other. Source pads 93*a* serving as ground terminals are formed along both edges so as to embrace the gate pad 93*b* and drain pad 93*c*. The gate pad 93*b* is electrically connected to the gate lead 95*b* and the drain pad 93*c* is electrically connected to the drain lead 95*c* by respective slender bonding wires 94 made of gold (Au) or the like. The source pads 93*a* on both sides and the source lead 95*a* are connected on one side by two bonding wires 94. Grounding is enhanced by the four bonding wires, which is the total of the bonding wires on both sides.

In the sectional view of the semiconductor device 91 shown in FIG. 18, the resin vessel 96 has the cavity 98 at the center thereof. Within the cavity 98 of resin vessel 96, the terminal leads 95*a* to 95*c* are all exposed at (in flush with) the bottom of the cavity 98. Outside the resin vessel 96 the terminals leads 95*a* to 95*c* all protrude from the lower face of the resin vessel 96. Each lead is therefore bent within the resin of the resin vessel 96 outwardly from the cavity 98. Further, a resin cap 97 made of a molded resin, for example, is placed on the resin vessel 96, and the joining faces of the resin vessel 96 and resin cap 97 are bonded together as by an epoxy adhesive. The height of the resin vessel 96 alone is about 0.7 mm, the height of the package on which the resin cap 97 has been placed is about 1.3 mm, and the interior is hollow form a hollow space. The resin cap 97 covering the upper portion of the resin vessel 96 may be made a thin flat plate, bends of the lead frame may be reduced and the height can be reduced to less than 0.5 mm to make it possible to lower the overall height.

If the interior of the package is thus made hollow, parasitic capacitance between terminals can be reduced. Refer to the content of Patent Document 8 with regard to a package having a hollow structure, and reference is had to the content of Patent Document 9 with regard to a resin cap, the disclosure thereof being incorporated herein by thereto.

In the case of an MMIC in which a semiconductor chip has a power-supply terminal, e.g., in the top plan view of FIG. 17, the side on which the semiconductor chip 92 is secured by the source lead 95*a* is adopted as a ground terminal, a gap is provided at the sides of the semiconductor chip 92 by cutting and separating the source lead 95*a*, and one is adapted as the lead of a power-supply terminal. If this MMIC has pads (terminals) for bias and for switch control, etc., then leads are provided for these. In the punching of the lead frame, the frame of a metal plate is left at the periphery corresponding to each package and the frame of the metal plate is finally cut off and separated following assembly. The gap between the leads and the shape of the leads can therefore be set appropriately by a punching die. If the number of terminals is large, the top surface may be made rectangular and is not limited to the square shape. Further, the power-supply pad and lead of the power-supply terminal of the semiconductor chip can be connected by one or several bonding wires 94 in a manner similar to that of the ground terminal.

Seventh Exemplary Embodiment; Flip-Chip Mounting of Semiconductor Chip

Figure 19:
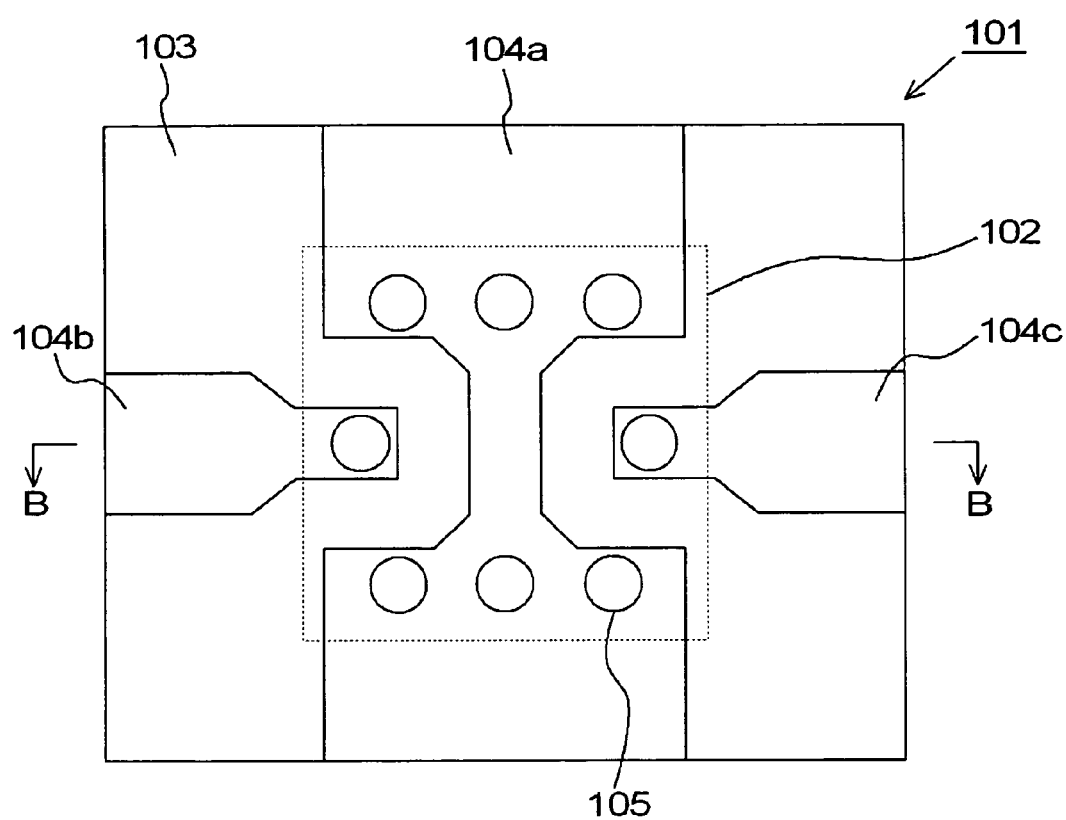
FIG. 19 is a top plan view of a semiconductor device according to a seventh exemplary embodiment of the present invention.
Figure 20:
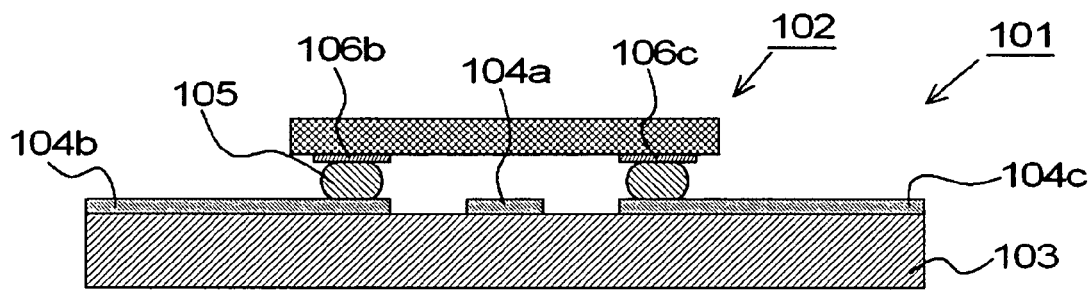
FIG. 20 is a sectional view taken along line B-B of FIG. 19.

A semiconductor device in which the semiconductor chip of the present invention is flip-chip-mounted directly on a circuit board will be described next as a seventh exemplary embodiment of the present invention. FIG. 19 is a top plan view of a semiconductor device 101, and FIG. 20 is a sectional view taken along line B-B of FIG. 19.

A multistage amplifier extending from low-noise amplification of input to an output section, a plurality of multistage amplifiers inclusive of switch changeover and various circuits that include multiple functions such as modulation and digital processing can be used as the circuits of the semiconductor device 101. A semiconductor chip 102 may be an MMIC or the like obtained by packaging FETs or passive elements (capacitors and inductors, etc.).

In the semiconductor device 101, wiring such as of gold (Au) or copper (Cu) is formed on the surface of a circuit board 103 made of a resin or ceramic such as bakelite or epoxy. The circuit board 103 is not limited to a single layer and multilayer wiring may be used. A metal layer for ground may be provided on the back surface or internally and may be adopted as a distribution-constant line of a microstrip or the like. Further, in the case of a printed board such as of resin, if etching or plating using a photoresist film or the like is employed to form wiring, then wiring can be formed more finely than with metal punching of a lead frame.

In the top plan view of the semiconductor device 101 shown in FIG. 19, the semiconductor chip 102 (indicated by the dashed line) is faced down and is connected to each of the wires on the surface of the circuit board 103 via metal columns 105 serving as bumps. In the sectional view of semiconductor device 101 shown in FIG. 20, a gate pad 106b for input is electrically connected to gate wiring 104b, and a drain pad 106c for output is electrically connected to drain wiring 104c. Further, a gap of an order of 100 to 300 μm (0.1 to 0.3 mm) is provided between the semiconductor chip 102 and circuit board 103 by the metal columns 105. It should be noted that the same holds true for a source pad serving as ground and for source wiring, although these are not illustrated in the sectional view of FIG. 20.

In the case of an MMIC in which a semiconductor chip has a power-supply terminal, if slender source wiring 104a underlying the semiconductor chip 102 in, e.g., the top plan view of FIG. 19 is cut away and separated, then the source wiring 104a can be made wiring for ground and power-supply. Further, if this MMIC has pads (terminals) for bias and for switch control, etc., then it will suffice if the circuit board 103 is suitably provided with wiring(s) for these.

The metal columns 105 may be individual metals such as gold (Au), copper (Cu), silver (Ag), aluminum (Al), nickel (Ni), tin (Sn), indium (In), antimony (Sb) or bismuth (Bi), alloys of these, laminates or balls. In particular, the latter-half elements Sn, In, Sb and Bi are solder materials and, taking Sn as an example, alloys such as gold tin (AuSn), silver tin (AgSn) or copper tin (CuSn) may be used. Further, in order to adjust the melting point or softening temperature and assure bonding to oxygen, use may be made of an alloy in which many elements are mixed. The formation of the metal columns 105 can be achieved by plating using a thick photoresist film as a mask, printing a metal paste or adhering balls. In the case of plating, it is possible to follow the plating of Au or Cu with plating of a solder material such as Sn, In or Bi. Further, as for the formation of the metal columns 105, the metal columns can first be formed on the side of the semiconductor chip 102 or on the side of the circuit board 103 or on both sides, after which the two are brought into opposition and affixed by application of pressure and temperature.

In order to protect the surface of the circuit wiring, it is covered with a protective film (not shown) such as of high-viscosity epoxy resin in such a manner that the film does penetrate into the gap between the circuit wiring and the semiconductor chip 102. Further, use may be made of a humidity-resistant resin sheet that is softened by heat. Further, after the wiring surface is covered with high-viscosity epoxy resin or the like, the back side of the semiconductor chip 102 may be cut away and a metal film for heat dissipation, ground or high-frequency shielding may be deposited. Further, a thin aluminum film (aluminum foil) or copper film may be affixed as this metal film. Further, these metal films may be affixed for the purpose of high-frequency shielding without cutting away the covering resin.

Eighth Exemplary Embodiment; Flip-Chip Mounting Package of Semiconductor Chip

Figure 21:
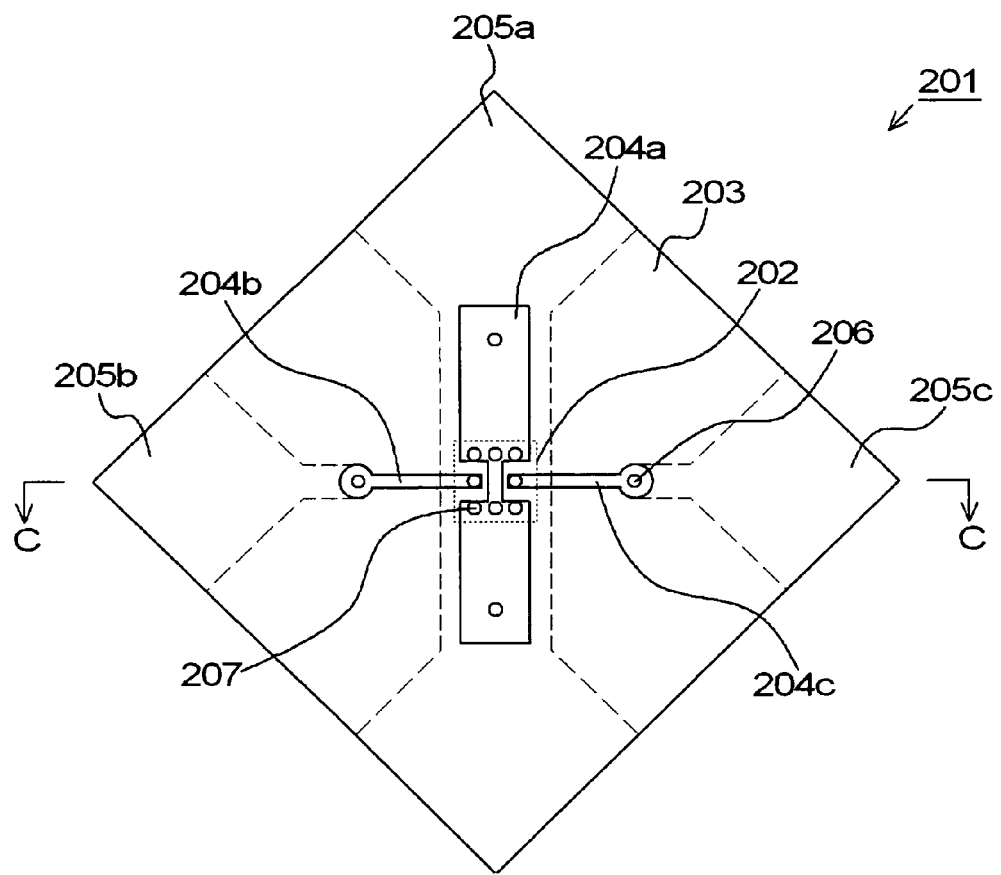
FIG. 21 is a top plan view of a semiconductor device according to an eighth exemplary embodiment of the present invention.

A semiconductor device in which only one semiconductor chip solely of a FET is flip-chip-mounted will be described next as an eighth exemplary embodiment of the present invention. FIG. 21 is a top plan view of a semiconductor device 201 according to an eighth exemplary embodiment of the present invention, and FIG. 22 is a sectional view taken along line C-C of FIG. 21.

In the top plan view of the semiconductor device 201 shown in FIG. 21, a circuit board 203 is a resin printed board or a ceramic board and has through-holes 206 at fixed intervals. Both surfaces of the board and the through-holes 206 are covered by copper film. Wiring and terminals are formed on both surfaces. A semiconductor chip 202 (indicated by the lines of short dashes) of a FET is mounted at the center of the circuit board 203.

Source wiring 204a, gate wiring 204b and drain wiring 204c extend from respective metal columns 207 toward respective through-holes 206. The source wiring 204a, gate wiring 204b and drain wiring 204c is electrically connected to source terminals 205a, a gate terminal 205b and a drain terminal 205c, respectively, which are formed on the underside surface at respective corners (indicated by the lines of long dashes), via the copper film within the respective through-holes 206. The source terminals 205a at both corners are connected along a diagonal line.

Figure 22:
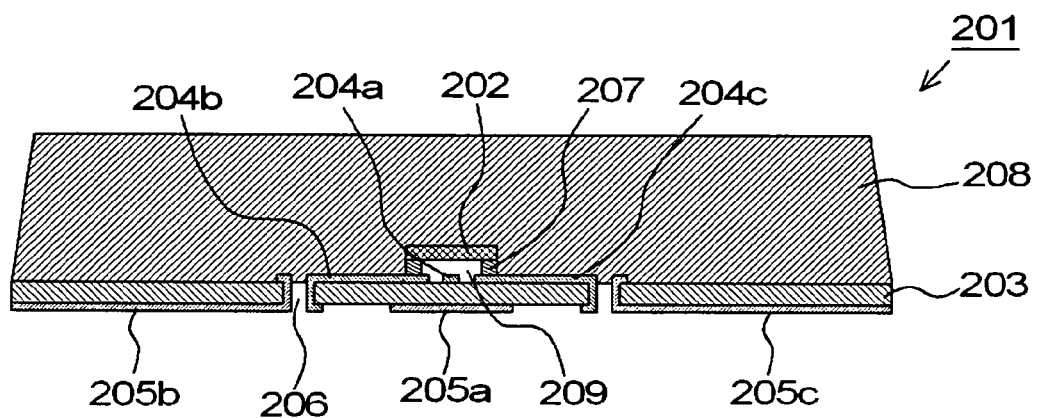
FIG. 22 is a sectional view taken along line C-C of FIG. 21.

In the sectional view of the semiconductor device 201 shown in FIG. 22, the top side and underside surfaces are electrically connected by the copper film that passes through the through-holes 206 of the circuit board 203. The gate wiring 204b on the top side surface is electrically connected to the gate terminal 205b on the underside surface, and the drain wiring 204c on the top side surface is electrically connected to the drain terminal 205c on the bottom side surface. The semiconductor chip 202 of the FET is mounted on the top side surface via the metal columns 207 serving as bumps. The front side surface is sealed by a sealing resin 208 using, e.g., of a molded resin or resin sheet, etc. Preferably, however, for the lower side (underside) of the semiconductor chip 202 a high-viscosity resin is employed so as to form a hollow 209. Further, although the height of the sealing resin 208 can be set appropriately, it is possible to make the height of the overall package low, i.e., less than 0.5 mm.

During the course of manufacture, FETs are arrayed on a wide printed board and assembled. After the sealing resin 208 is formed on each FET, the FETs are fixed as by an adhesive sheet and the circuit board 203 is cut and separated into individual boards as by dicing. At this time the circuit board 203 is cut in such a manner that unnecessary through-holes 206 are traversed. Further, before the circuit board 203 is cut, it is also possible to build up low-temperature binder on the surface of the terminals on the underside as necessary.

Ninth Exemplary Embodiment; Top-Side Structure of Another Semiconductor Chip Next, a semiconductor device of reduced area in a semiconductor chip solely of a FET will be described as a ninth exemplary embodiment of the present invention.

Figure 23:
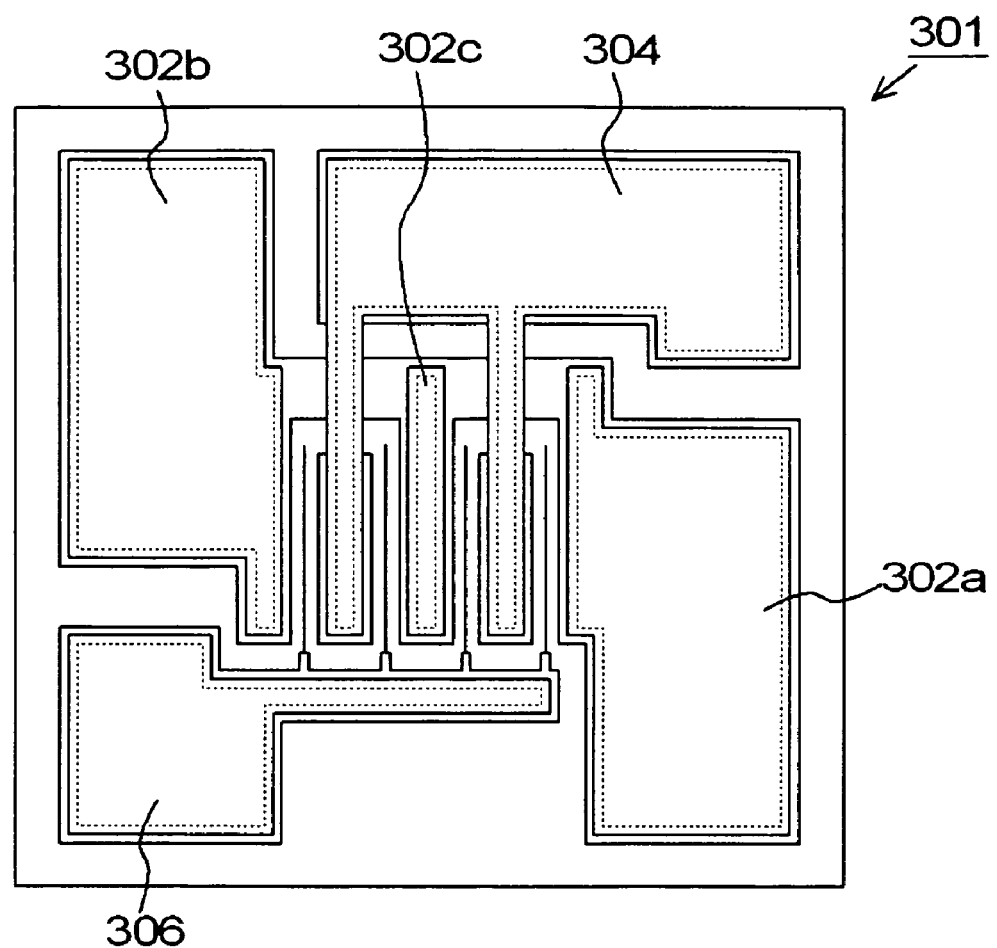
FIG. 23 is a top plan view of a semiconductor chip according to a ninth exemplary embodiment of the present invention.

FIG. 23 is a top plan view of a semiconductor chip 301 according to the ninth exemplary embodiment. In the semiconductor chip 301 solely of a FET, an element region at the center thereof is similar to the element region of the semiconductor chip 21 according to the first exemplary embodiment shown in FIG. 3. In the ninth exemplary embodiment, however, the area is reduced by moving the terminal pad of each electrode closer to one corner. In the first exemplary embodiment illustrated in FIG. 3, the source pads 22a, 22b serving as two ground terminals are large and placed on opposite sides, and the drain pad 24a serving as the output terminal and gate pad 26 serving as the input terminal are small and placed between the two source pads 22a, 22b. In the ninth exemplary embodiment shown in FIG. 23, a gate pad 306 and drain pad 304 are placed at mutually (diametrally) opposing corners, and two source pads 302a, 302b are placed at the remaining corners so as to oppose each other. Further, the two opposing source pads 302a, 302b are formed broadly in such a manner that two bonding wires can be laid. Further, in the case of an MMIC in which the semiconductor chip 301 has a power-supply terminal, one of the source pads 302a, 302b may be a ground terminal and the other may be the power-supply terminal.

Ninth Exemplary Embodiment; Packaging of Another Semiconductor Chip

Figure 24:
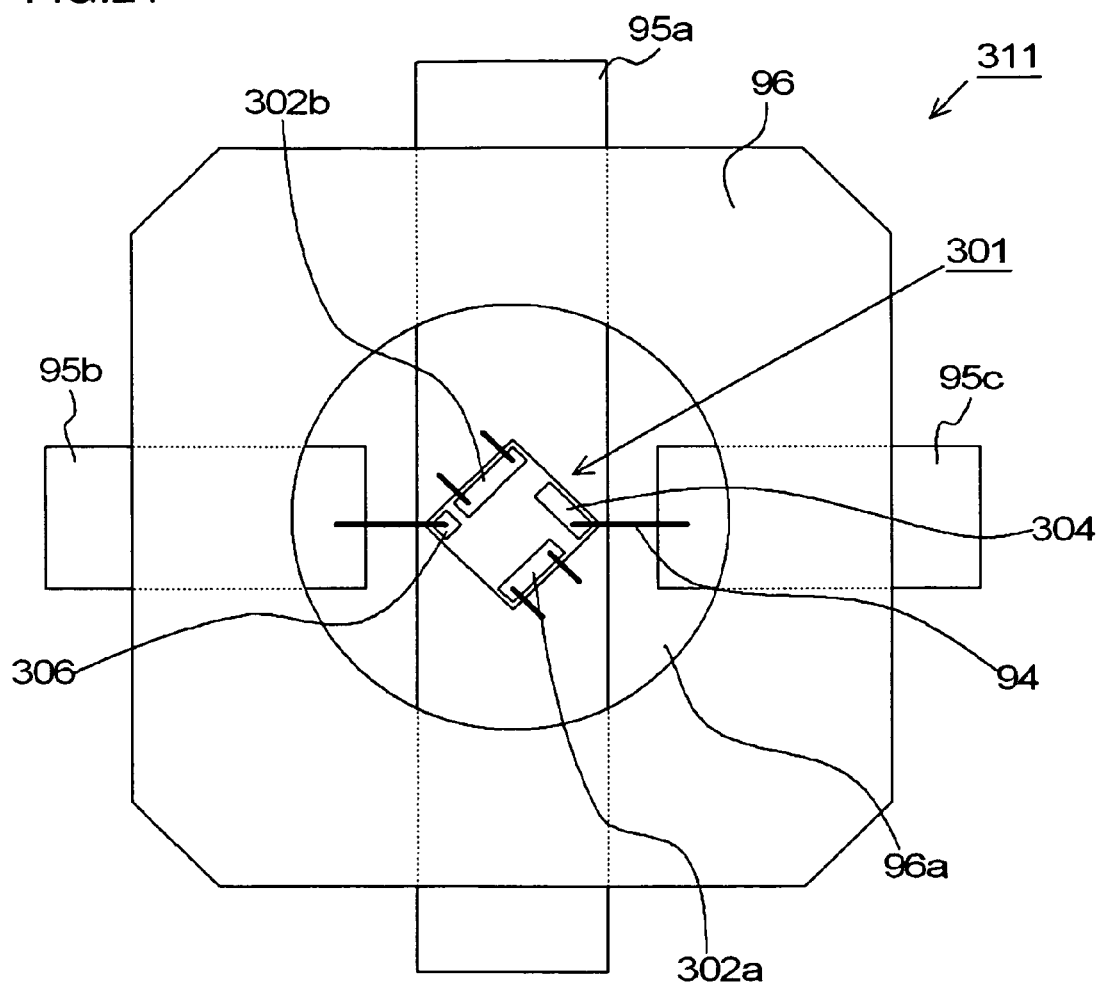
FIG. 24 is a top plan view of a semiconductor device on which the semiconductor chip shown in FIG. 23 has been mounted.
Figure 25:
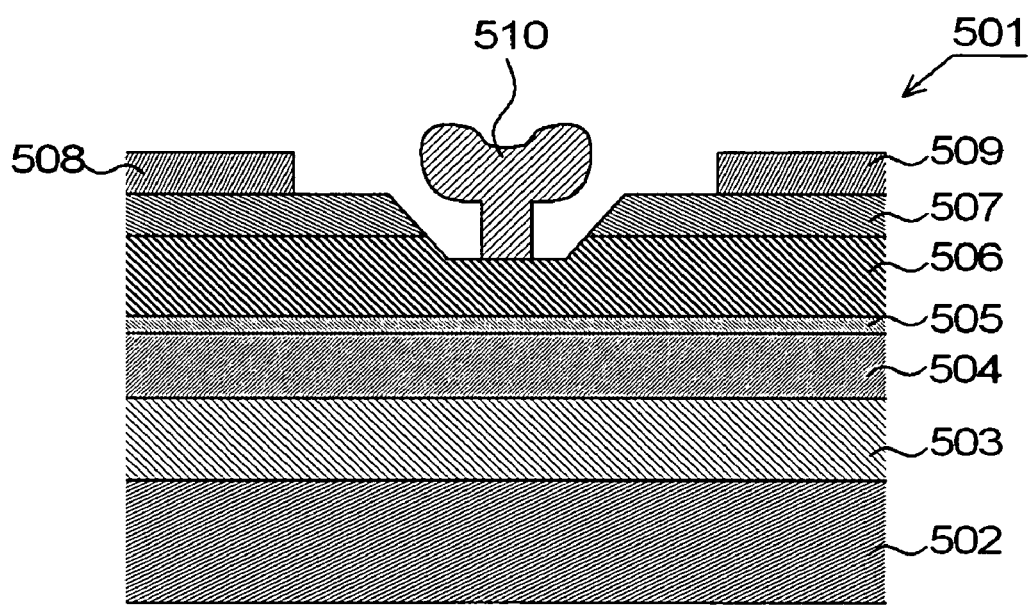
FIG. 25 is a sectional view of a field-effect transistor according to a background art.
Figure 26:
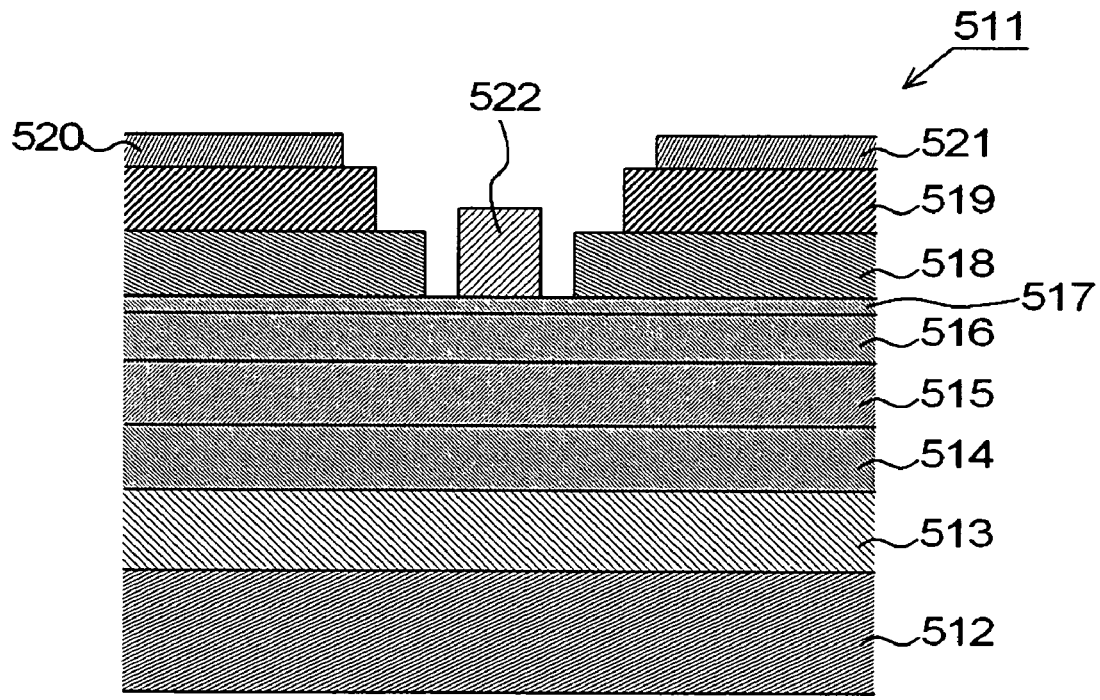
FIG. 26 is a sectional view of a field-effect transistor according to a background art.
Figure 27:
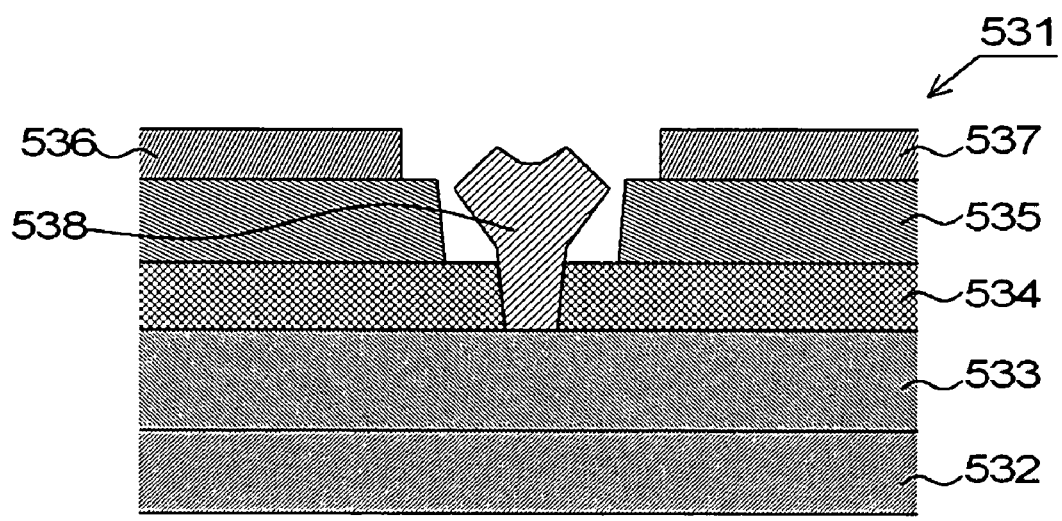
FIG. 27 is a sectional view of a field-effect transistor according to a background art.

FIG. 24 is a top plan view of a semiconductor device 311 in which the semiconductor chip 301 is mounted in a resin package. In FIG. 24, elements similar to those of FIG. 17 (sixth exemplary embodiment) are designated by like reference characters. In the top plan view of the semiconductor device 311 shown in FIG. 24, the semiconductor chip 301 is oriented in such a manner that the gate pad 306 and drain pad 304 will oppose the respective leads. That is, the semiconductor chip 301 is rotated 45 degree in comparison with the form shown in FIG. 17. As a result, the bonding wire 94 electrically connecting the gate pad 306 and gate lead 95b and the bonding wire 94 electrically connecting the drain pad 304 and drain lead 95c can be made the minimum length. Further, in order to improve grounding from the two source pads 302a, 302b to the underlying source leads 95a, the electrical connection to one pad is achieved by the two bonding wires 94.

In the case of an MMIC in which the semiconductor chip 301 has a power-supply terminal, the side of the source lead 95a on which the semiconductor chip 301 is mounted is adopted as the lead of the ground terminal, the source lead can be cut and separated and one can be adopted as the lead of the power-supply terminal, as described above with regard to the sixth exemplary embodiment. Furthermore, in order to connect the bonding wire to the lead of the power-supply terminal near the semiconductor chip 301, the source lead 95a may be provided with gaps and separated into a triangular mountain shape in conformity with the shape of the tilted semiconductor chip 301. This can be set appropriately by a die for punching the load frame.

The FET, semiconductor chip and semiconductor device of the present invention has been described based upon the foregoing exemplary embodiments. However, the present invention is not limited to the foregoing exemplary embodiments and it goes without saying that the foregoing exemplary embodiments can be modified, changed and improved in various ways within the scope of the invention and based upon the fundamental technical ideal of the present invention. Further, various combinations, substitutions and selections can be made with regard to the various disclosed elements within the scope of the claim of the present invention.

Further objects and expanded forms of the present invention will become obvious from the totality of the disclosures of the invention inclusive of the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A field-effect transistor comprising the following layers built up on a GaAs semiconductor substrate comprising gallium and arsenic, said built up layers comprising:
    an i-type GaAs layer serving as a buffer layer and comprising gallium and arsenic and containing no carrier impurities;
    an i-type InGaAs layer serving as a two-dimensional gas layer and comprising indium, gallium and arsenic and containing no carrier impurities;
    an n-type AlGaAs layer serving as an electron supply layer and comprising aluminum, gallium and arsenic and containing an n-type carrier impurity;
    a gate electrode being provided on and in linear Schottky contact with said n-type AlGaAs layer serving as the electron supply layer;
    an n-type InGaP layer serving as an etching stop layer spaced away from both sides of the gate electrode and comprising indium, gallium and phosphorous and containing an n-type carrier impurity; and
    an i-type GaAs layer serving as a spacer layer and comprising gallium and arsenic and containing no carrier impurities is provided between said i-type InGaAs layer serving as the two-dimensional electron gas layer and said n-type AlGaAs layer serving as the electron supply layer.

2. The field-effect transistor according to claim 1, wherein said n-type AlGaAs layer serving as the electron supply layer has a high-concentration n-type AlGaAs layer and a low-concentration n-type AlGaAs layer as lower and upper layers, respectively, these layers comprising different concentrations of the n-type carrier impurity;
    the high-concentration n-type AlGaAs layer comprises a layer on a side of said i-type InGaAs layer serving as the two-dimensional electron gas layer; and
    the low-concentration n-type AlGaAs layer comprises a layer on a side of said gate electrode and has an n-type carrier concentration lower than that of the high-concentration n-type AlGaAs layer.

3. The field-effect transistor according to claim 1, wherein the n-type carrier impurity comprises silicon (Si).

4. The field-effect transistor according to claim 1, wherein at least one i-type InGaAs layer comprising aluminum, gallium and arsenic and containing no carrier impurities is disposed (inserted) within said i-type GaAs layer serving as the buffer layer.

5. The field-effect transistor according to claim 1, wherein at least one or both of a p-type GaAs layer containing a p-type carrier impurity and comprising gallium and arsenic and a p-type AlGaAs layer containing a p-type carrier impurity and comprising gallium, arsenic and aluminum is disposed (inserted) as an opposite-polarity layer within said i-type GaAs layer serving as the buffer layer.

6. The field-effect transistor according to claim 5, wherein the p-type carrier impurity comprises at least one element selected from the group of carbon (C), beryllium (Be) and magnesium (Mg).

7. The field-effect transistor according to claim 1, wherein an AlGaAs layer serving as a Schottky layer and comprising aluminum, gallium and arsenic is disposed (inserted) between said n-type AlGaAs layer serving as the electron supply layer, and the gate electrode and said n-type InGaP layer serving as the etching stop layer, this AlGaAs layer serving as the Schottky layer containing no carrier impurities or containing a p-type carrier impurity.

8. The field-effect transistor according to claim 1, further comprising:
   an n-type GaAs layer serving as a contact layer and comprising gallium and arsenic and containing an n-type carrier impurity, at a substantially same lateral position as the etching stop layer, said etching stop layer and contact layer being built up successively on said n-type AlGaAs layer serving as the electron supply layer; and
   a source electrode and a drain electrode provided as electrodes on and in band-shaped ohmic contact with said n-type GaAs layer serving as the contact layer, these electrodes being placed on respective sides and spaced away from edges of the contact layer.

9. The field-effect transistor according to claim 8, wherein said n-type AlGaAs layer serving as the electron supply layer is formed as at least one element (device) region on the GaAs semiconductor substrate,
   wherein an element isolation region electrically insulating the element region is provided outside the element region, and
   wherein said element isolation region being a removed region obtained by removal extending from the contact layer to part of the way of the buffer layer, or a diffusion region obtained by diffusing at least one element selected from the group of helium (He), boron (B), nitrogen (N) and oxygen (O) extending from the contact layer to a half way of the buffer layer.

10. The field-effect transistor according to claim 9, wherein the at least one element region comprises a plurality of field-effect transistor constituent units each constituted by a gate electrode, source electrode and drain electrode;
   the plurality of field-effect transistor constituent units are disposed in such a manner that a plurality of the linear gate electrodes are arranged in parallel; and
   two mutually adjacent of field-effect transistor constituent units among the plurality of field-effect transistor constituent units share either the source electrode or the drain electrode.

11. The field-effect transistor according to claim 9, further comprising source wiring and drain wiring on the element isolation region, the source wiring leading electrically to the plurality of source electrodes and the drain wiring leading electrically to the plurality of drain electrodes,
   wherein the drain wiring intersects the source wiring so as to pass over the source wiring.

12. The field-effect transistor according to claim 11, wherein a hollow air bridge underlies the drain wiring at a portion where the drain wiring passes over the source wiring.

13. The field-effect transistor according to claim 8, wherein contact spacing between the gate electrode that touches said n-type AlGaAs layer serving as the electron supply layer and the n-type InGaP layer serving as the etching stop layer is 0.1 µm or greater, and
   wherein contact spacing on the side of the drain electrode is the same as or larger than the contact spacing on the side of the source electrode.

14. The field-effect transistor according to claim 8, wherein the source electrode and the drain electrode comprise germanium (Ge) and nickel (Ni) or germanium (Ge), nickel (Ni) and gold (Au).

15. The field-effect transistor according to claim 8, wherein the source electrode and the drain electrode are diffused into said n-type GaAs layer serving as the contact layer, to end at part of the way without reaching said n-type AlGaAs layer serving as the electronic supply layer.

16. The field-effect transistor according to claim 1, wherein the gate electrode comprises a Schottky metal layer that makes ohmic contact with said n-type AlGaAs layer serving as the electron supply layer or said AlGaAs layer serving as the Schottky layer, and a gate wiring layer on the Schottky metal layer and having a resistivity lower than that of the Schottky metal layer.

17. The field-effect transistor according to claim 16, wherein the Schottky metal layer of the gate electrode comprises at least one selected from the group consisting of titanium (Ti), vanadium (V), chrome (Cr), zirconium (Zr), niobium (Nb), molybdenum (Mo), hafnium (Hf), tantalum (Ta), tungsten (W) and a silicide or nitride thereof, and
   wherein the gate wiring layer comprises at least one selected from the group consisting of aluminum (Al), nickel (Ni), gold (Au) and copper (Cu).

18. The field-effect transistor according to claim 1, wherein a cross section of the gate electrode perpendicular to the direction in which the gate electrode extends linearly comprises any one selected from the group of T-shaped, rectangular and trapezoidal.

19. The field-effect transistor according to claim 1, further comprising a protective insulating film for covering at least an exposed surface of said n-type AlGaAs layer serving as the electron supply layer or the AlGaAs layer serving as the Schottky layer and the gate electrode,
   wherein said protective insulating film comprises at least one selected from the group of silicon nitride film, boron nitride film, aluminum nitride film and silicon oxide film.

20. The field-effect transistor according to claim 19, further comprising a silicon oxide film, which underlies said protecting insulating film, on said n-type GaAs layer serving as the contact layer other than the portion of a source electrode and drain electrode.

21. A square semiconductor chip, comprising:
   a field-effect transistor;
   at least one element region comprising the field-effect transistor;
   an element isolation region electrically insulating the element region;
   an input terminal electrically connected to a gate electrode;
   a ground terminal electrically connected to a source electrode; and
   an output terminal electrically connected to a drain electrode,
   wherein said field-effect transistor includes the following layers built up on a GaAs semiconductor substrate comprising gallium and arsenic, said built up layers comprising:

an i-type GaAs layer serving as a buffer layer comprising gallium and arsenic and containing no carrier impurities;

an i-type InGaAs layer serving as a two-dimensional gas layer comprising indium, gallium and arsenic and containing no carrier impurities;

an n-type AlGaAs layer serving as an electron supply layer comprising aluminum, gallium and arsenic and containing an n-type carrier impurity, the gate electrode being provided on and in linear Schottky contact with said n-type AlGaAs layer serving as the electron supply layer, wherein said field effect transistor further includes:

an n-type InGaP layer serving as an etching stop layer spaced away from both sides of the gate electrode and comprising indium, gallium and phosphorous and containing an n-type carrier impurity, and, at the substantially same lateral position, an n-type GaAs layer serving as a contact layer comprising gallium and arsenic and containing an n-type carrier impurity, these being built up successively on said n-type AlGaAs layer serving as the electron supply layer; and a source electrode and a drain electrode provided as electrodes on and in band-shaped ohmic contact with said n-type GaAs layer serving as the contact layer, these electrodes being placed on respective sides and spaced away from edges of the contact layer, wherein, in said element isolation region and from among four extremities which are sides or corners of said square semiconductor chip, said input terminal and said output terminal are disposed at two mutually opposing extremities so as to oppose each other, and wherein at least one ground terminal is disposed at the other mutually opposing extremities.

22. The semiconductor device according to claim 21, wherein said semiconductor chip is accommodated in a hollow package formed of resin or ceramic the interior of which is a hollow vessel, four terminal leads are led out from within the hollow package, and at least three of the terminals and the four terminal leads of said semiconductor chip are electrically connected by metal wires in such a manner that at least one terminal lead corresponds to one terminal.

23. The device according to claim 22, wherein a terminal lead electrically connected to said input terminal and a terminal lead electrically connected to said output terminal are let out from the hollow package so as to oppose each other, and wherein a terminal lead electrically connected to said ground terminal is led out from the hollow package in an opposing direction.

24. The semiconductor device according to claim 21, further comprising a resin or ceramic circuit board with circuit wiring formed on a surface thereof, wherein the wiring of said circuit board is electrically connected to said input terminal, said ground terminal and said output terminal in such a manner that a surface of said semiconductor chip on which the element isolation region has been formed will face said circuit board, and wherein said semiconductor chip and said circuit board define a hollow space therebetween.

25. The device according to claim 24, wherein the surface of said circuit board is covered by a resin or a resin sheet film or is further covered by a gold film.

26. The device according to claim 24, wherein said circuit board comprises wiring and terminals that penetrate from a top side to an underside, wherein each of the terminals of said semiconductor chip and the wiring on the top side of said circuit board are electrically connected in such a manner that a surface of said semiconductor chip on which the element isolation region has been formed will face said circuit board, and wherein said semiconductor chip and said circuit board define a hollow space therebetween.

* * * * *